(12) United States Patent
Inoue et al.

(10) Patent No.: US 10,409,128 B2
(45) Date of Patent: Sep. 10, 2019

(54) THIN FILM TRANSISTOR SUBSTRATE, METHOD OF MANUFACTURING THE SAME, AND DISPLAY DEVICE

(71) Applicant: Mitsubishi Electric Corporation, Tokyo (JP)

(72) Inventors: Kazunori Inoue, Kumamoto (JP); Takaharu Konomi, Kumamoto (JP); Takeshi Kubota, Tokyo (JP); Toshiaki Fujino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/816,653

(22) Filed: Nov. 17, 2017

(65) Prior Publication Data

US 2018/0143474 A1     May 24, 2018

(30) Foreign Application Priority Data

Nov. 21, 2016 (JP) .................................. 2016-225657

(51) Int. Cl.
    *G02F 1/1368*       (2006.01)
    *H01L 27/12*        (2006.01)
      (Continued)

(52) U.S. Cl.
    CPC ...... *G02F 1/1368* (2013.01); *G02F 1/133345* (2013.01); *G02F 1/134336* (2013.01); *G02F 1/134363* (2013.01); *G02F 1/136209* (2013.01); *G02F 1/136227* (2013.01); *H01L 27/1225* (2013.01); *H01L 27/1244* (2013.01);
      (Continued)

(58) Field of Classification Search
None
See application file for complete search history.

(56) References Cited

U.S. PATENT DOCUMENTS 9,207,504 B2    12/2015   Kimura
9,213,206 B2    12/2015   Kimura
            (Continued)

FOREIGN PATENT DOCUMENTS

JP     H02-054217 A    2/1990
JP     H03-059522 A    3/1991
         (Continued)

OTHER PUBLICATIONS

Nomura et al; Room-temperature fabrication of transparent flexible thin-film transistors using amorphous oxide semiconductors; Nature; Nov. 2004; vol. 432; pp. 488-492.
(Continued)

*Primary Examiner* — Herve-Louis Y Assouman
(74) *Attorney, Agent, or Firm* — Studebaker & Brackett PC

(57) ABSTRACT

A plurality of pixel electrodes disposed in a matrix are electrically connected with a plurality of first thin film transistors, respectively. Coloring layers in a plurality of colors overlap, in a plan view, with two or more pixel electrodes adjacent to each other in one direction among the plurality of pixel electrodes. Channel layers of the first thin film transistors are covered from above by a coloring laminated body including end parts of the respective coloring layers in at least two colors among the coloring layers in a plurality of colors, the end parts overlapping with each other in the plan view.

20 Claims, 32 Drawing Sheets

(51) Int. Cl.
*G02F 1/1362* (2006.01)
*G02F 1/1333* (2006.01)
*G02F 1/1343* (2006.01)
*H01L 29/786* (2006.01)

(52) U.S. Cl.
CPC .... *H01L 27/1288* (2013.01); *G02F 1/136286* (2013.01); *G02F 2001/134318* (2013.01); *G02F 2001/136222* (2013.01); *G02F 2001/136295* (2013.01); *G02F 2201/52* (2013.01); *G02F 2202/10* (2013.01); *H01L 29/7869* (2013.01)

(56) References Cited

U.S. PATENT DOCUMENTS

| | | | |
|---|---|---|---|
| 2006/0238450 A1* | 10/2006 | Onodera | G02F 1/1309 345/60 |
| 2007/0090365 A1 | 4/2007 | Hayashi et al. | |
| 2009/0189153 A1 | 7/2009 | Iwasaki et al. | |
| 2009/0263921 A1* | 10/2009 | Lee | G02F 1/133514 438/29 |
| 2011/0096259 A1* | 4/2011 | Lee | G02B 5/201 349/41 |
| 2011/0134353 A1* | 6/2011 | Kimura | G02F 1/134363 349/46 |
| 2012/0088325 A1* | 4/2012 | Fujiyoshi | G02F 1/133516 438/30 |
| 2014/0070211 A1 | 3/2014 | Iwasaki et al. | |
| 2014/0299881 A1* | 10/2014 | Oda | H01L 27/124 257/59 |
| 2015/0318405 A1 | 11/2015 | Hayashi et al. | |
| 2015/0333115 A1* | 11/2015 | Yang | H01L 27/12 257/40 |
| 2016/0154283 A1 | 6/2016 | Kimura | |

FOREIGN PATENT DOCUMENTS

| | | |
|---|---|---|
| JP | H03-237432 A | 10/1991 |
| JP | H04-253028 A | 9/1992 |
| JP | 2005-077822 A | 3/2005 |
| JP | 2007-115902 A | 5/2007 |
| JP | 2007-281409 A | 10/2007 |
| JP | 2014-002392 A | 1/2014 |

OTHER PUBLICATIONS

Chuang et al.; Photosensitivity of Amorphous IGZO TFTs for Active-Matrix Flat-Panel Displays; SID 08 Digest; 2008; pp. 1215-1218.

Gosain et al.; Instability of Amorphous Indium Gallium Zinc Oxide Thin Film Transistors under Light Illumination; Japanese Journal of Applied Physics; 2009; vol. 48; pp. 03B018-1 to 03B018-5.

* cited by examiner

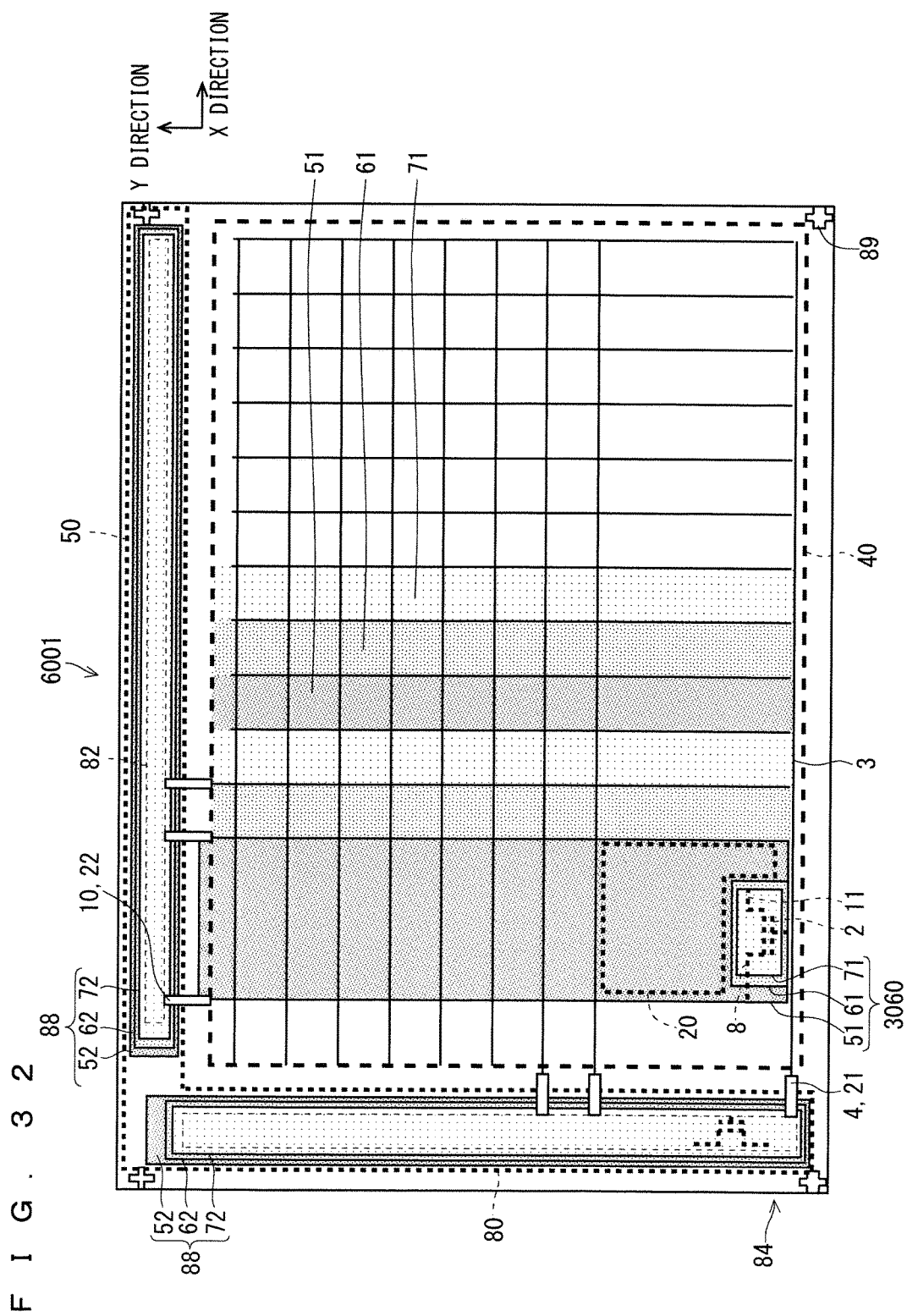

THIN FILM TRANSISTOR SUBSTRATE, METHOD OF MANUFACTURING THE SAME, AND DISPLAY DEVICE

BACKGROUND OF THE INVENTION

Field of the Invention

The present invention relates to a thin film transistor (TFT) substrate including a thin film transistor as a switching device, a method of manufacturing the same, and a display device including the same.

Description of the Background Art

A thin film transistor substrate (hereinafter also referred to as a "TFT substrate") is included in an electrooptical device such as a liquid crystal display device (hereinafter also referred to as an "LCD") as a display device using liquid crystals. A semiconductor device including a TFT is thin and consumes low electric power, and thus has been increasingly applied to flat panel displays.

Examples of LCDs include a simple matrix type LCD and a TFT-LCD that includes a TFT as a switching device for each pixel. The TFT-LCD is superior to the simple matrix type LCD particularly in display quality, and has been widely used in display products such as a mobile computer, a laptop personal computer, and a television.

Typically, the TFT-LCD is provided with a liquid crystal display panel including a TFT substrate and a counter substrate bonded to each other with a constant gap therebetween in which a layer of liquid crystals is injected and sealed. The TFT substrate includes a TFT configured to drive, by switching, pixels in a plurality of pixel regions disposed in an array. The counter substrate includes a color filter (CF). Polarization plates are provided on front and back surface sides of the liquid crystal display panel, and a backlight is provided outside of one of the polarization plates. The color filters provided to the counter substrate are typically in three colors of red (R), green (G), and blue (B) to achieve color display.

For example, Japanese Patent Application Laid-Open No. 2-54217 (1990), Japanese Patent Application Laid-Open No. 3-237432 (1991), and Japanese Patent Application Laid-Open No. 4-253028 (1992) each discloses, as another configuration different from the above-described configuration, a TFT-LCD configuration in which a color filter is disposed on a TFT substrate, not on a counter substrate. The TFT substrate thus configured is called a CF on-array structure or an on-chip CF layer structure. The CF on-array structure can provide an increased positioning accuracy of a color filter layer disposed on the plurality of pixel regions of a TFT substrate as compared to the conventional configuration in which a TFT substrate is bonded to a counter substrate including a color filter. Thus, the CF on-array structure can reduce color shift, which leads to a high aperture ratio of each pixel, in other words, effective use of the entire pixel as a display region, and as a result, can obtain a high-quality display characteristic with sufficient brightness, for example.

In the switching device of a TFT substrate included in a display device, a channel layer as an active layer of a TFT was made of amorphous silicon (a-Si) in the past. Recently, a TFT including a channel layer made of an oxide semiconductor has been increasingly popularly developed. The oxide semiconductor has a mobility higher than that of the conventionally used amorphous silicon, which leads to a small-sized and high-performance TFT. Technologies of such TFTs are disclosed in, for example, Japanese Patent Application Laid-Open No. 2005-77822, Japanese Patent Application Laid-Open No. 2007-281409, and Kenji Nomura et al., "Room-temperature fabrication of transparent flexible thin-film transistors using amorphous oxide semiconductors", Nature November 2004, Vol. 432, pp. 488 to 492.

A typical oxide semiconductor material has a translucent property with an energy bandgap of 3 eV or larger, and thus it has been conventionally said that the oxide semiconductor material absorbs a small amount of visible light and has a characteristic that is unlikely to change. However, as disclosed in, for example, Chiao-Shun Chuang et al., "Photosensitivity of Amorphous IGZO TFTs for Active-Matrix Flat-Panel Displays", SID 08 DIGEST, 2008, pp. 1215 to 1218, and Dharam Pal Gosain et al., "Instability of Amorphous Indium Gallium Zinc Oxide Thin Film Transistors under Light Illumination", Japanese Journal of Applied Physics 2009, Vol. 48, pp. 03B018-1 to 03B018-5, the characteristic of a TFT made of an oxide semiconductor material significantly degrades for light in a short wavelength region, in particular, ultraviolet light having a wavelength of 400 nm or shorter, in some cases.

For example, Japanese Patent Application Laid-Open No. 2007-115902 discloses, as a method for solving the above-described problem, a structure in which a light-shielding layer made of a light-shielding material such as metal or metal silicide is disposed above a TFT including a channel layer made of oxide semiconductor. Japanese Patent Application Laid-Open No. 2014-2392 discloses a CF on-array structure in which an R color filter layer covers all TFTs.

SUMMARY OF THE INVENTION

However, the method disclosed in Japanese Patent Application Laid-Open No. 2007-115902 requires an additional photoengraving process of forming a light-shielding layer above a TFT formed on a TFT substrate, which results in decrease of productivity.

In the method disclosed in Japanese Patent Application Laid-Open No. 2014-2392, a TFT degrades when eye hole, peeling, or a loss due to a foreign object occurs to an R color filter layer, and as a result, a point defect occurs. In particular, when an R color filter layer in a relatively small independent island pattern is disposed on a TFT part corresponding to G and B color filters as illustrated in FIG. 21(B) of Japanese Patent Application Laid-Open No. 2014-2392, the R color filter layer is likely to peel off due to insufficient adhesive force. Experiment performed by the inventors has found that, when a film having a relatively small adhesive force is formed on a substrate, the film is more likely to be lost due to peeling as the film has a smaller size. In addition, at least two kinds of patterning photoengraving masks are needed because the pattern shape of the R color filter is different from the pattern shapes of the G and B color filters, which leads to cost increase.

The present invention is intended to solve the above-described problem and provide a technology for appropriately achieving light-shielding of a channel layer of a thin film transistor.

The present invention is a thin film transistor substrate includes a plurality of gate wires, a gate insulation film, a plurality of source wires, a plurality of first thin film transistors, a plurality of pixel electrodes, and coloring layers in a plurality of colors. The plurality of gate wires are disposed on a substrate. The gate insulation film covers the plurality of gate wires. The plurality of source wires intersect with the plurality of gate wires in a plan view while being insulated from the plurality of gate wires by the gate insulation film. The plurality of first thin film transistors are disposed in a matrix and corresponding to a plurality of respective intersection points at which the plurality of gate wires intersect with the plurality of source wires, and each include an oxide semiconductor layer as a channel layer. The plurality of pixel electrodes are disposed in a matrix and electrically connected with the plurality of respective first thin film transistors. The coloring layers in a plurality of colors each overlap, in the plan view, with two or more pixel electrodes adjacent to each other in one direction among the plurality of pixel electrodes. A coloring laminated body including end parts of respective coloring layers in at least two colors among the coloring layers in a plurality of colors, the end parts overlapping with each other in the plan view, covers the channel layer of the first thin film transistor from above. The coloring layers in a plurality of colors are a red coloring layer, a green coloring layer, and a blue coloring layer. A lowermost layer of the coloring laminated body is the red coloring layer or the green coloring layer.

Appropriate light-shielding can be provided to a channel layer of a thin film transistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 32 is a plan view illustrating the configuration of a TFT substrate according to a modification of the present invention.

DESCRIPTION OF THE PREFERRED EMBODIMENTS

<First Preferred Embodiment>
<Configuration of TFT Substrate>

Figure 1:
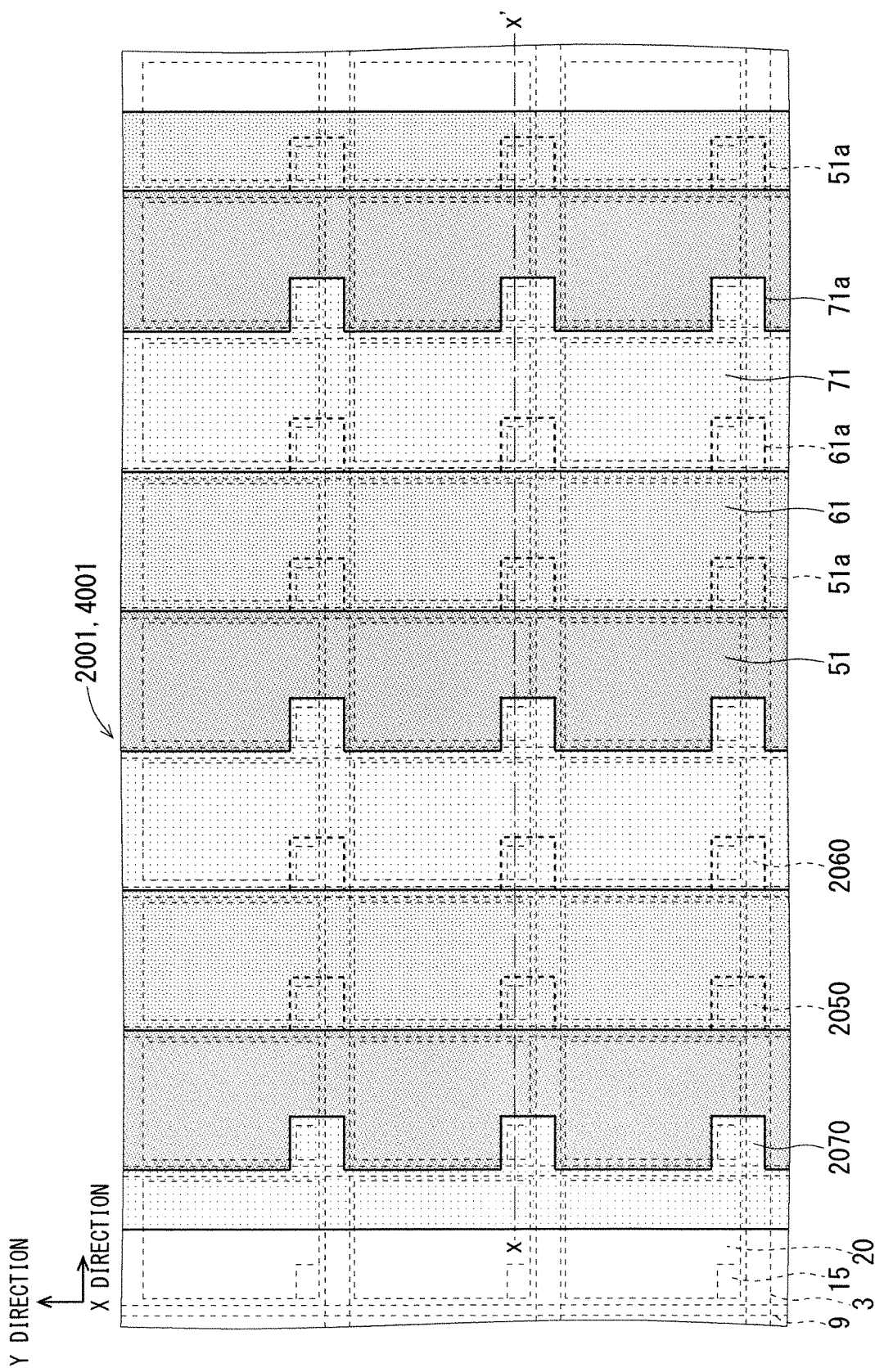
FIG. 1 is a plan view illustrating the configuration of a TFT substrate according to first and third preferred embodiments of the present invention.
Figure 2:
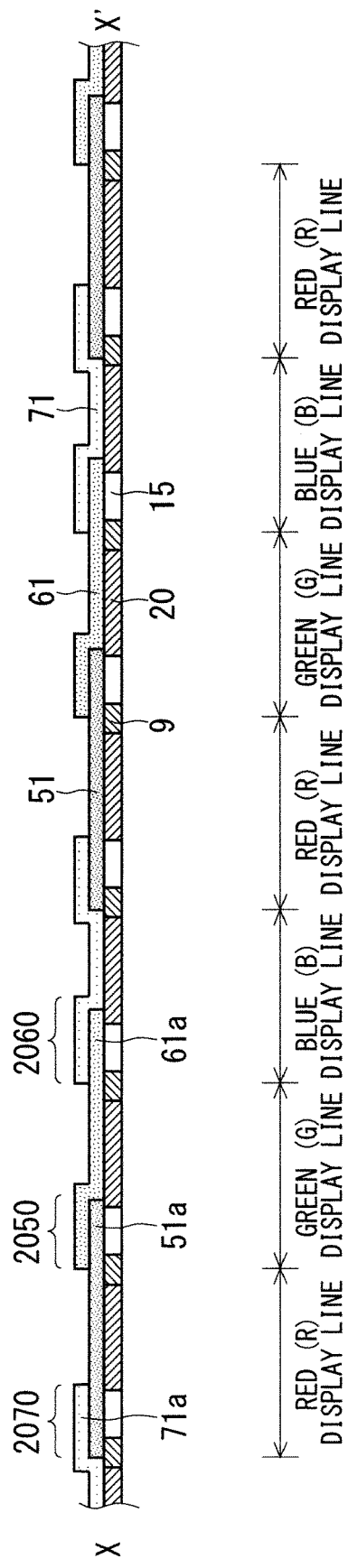
FIG. 2 is a cross-sectional view illustrating the configuration of the TFT substrate according to the first and third preferred embodiments of the present invention.

The following first describes with the configuration of a TFT substrate 2001 according to a first preferred embodiment of the present invention with reference to FIGS. 1 and 2. Among components described in preferred embodiments following the first preferred embodiment, any component same as or similar to that in the first preferred embodiment is denoted by an identical reference sign, and the description will be mainly made on any difference between the components.

FIG. 1 is a plan view illustrating a plane configuration of part of a pixel display region of the TFT substrate 2001 according to the first preferred embodiment. FIG. 2 is a cross-sectional view illustrating a sectional configuration taken along line X-X' in FIG. 1. In the following description, the TFT substrate 2001 is a TFT active matrix substrate on which a plurality of pixel regions are disposed in an array, and a display device including the TFT substrate 2001 is a light transmissive LCD in a twisted nematic (TN) mode or a vertical alignment (VA) mode.

As illustrated in FIG. 1, the TFT substrate 2001 includes a plurality of gate wires 3 as scanning signal lines extending in an X direction in the plan view, and a plurality of source wires 9 as display signal lines extending in a Y direction in the plan view. The plurality of gate wires 3 orthogonally intersect with the plurality of source wires 9 in the plan view, and an insulation film is disposed between the plurality of gate wires 3 and the plurality of source wires 9 as described later.

The TFT substrate 2001 in FIG. 1 includes a plurality of TFTs 15 as a plurality of first thin film transistors, and a plurality of pixel electrodes 20.

The plurality of TFTs 15 are each a pixel TFT provided for a pixel and disposed in a matrix and corresponding to a plurality of respective intersection points at which the plurality of gate wires 3 intersect with the plurality of source wires 9. In the following, as an example, the plurality of TFTs 15 are disposed near the intersection points between the plurality of gate wires 3 and the plurality of source wires 9. As described later, the plurality of TFTs 15 each include an oxide semiconductor layer as a channel layer. The oxide semiconductor channel layer is made of oxide such as InGaZnO containing indium (In), gallium (Ga), zinc (Zn), and oxygen (O).

Regions enclosed by the plurality of gate wires 3 and the plurality of source wires 9, which are orthogonal to each other are each a pixel region corresponding to one pixel. The plurality of pixel electrodes 20 are disposed in the plurality of respective pixel regions disposed in a matrix and thus disposed in a matrix similarly to the plurality of pixel regions.

Each TFT 15 is electrically connected with the corresponding gate wire 3 and source wire 9, and also electrically connected with the corresponding pixel electrode 20. The TFT 15 is disposed above a gate electrode as part of the gate wire 3, and thus light incidence on a lower part of the TFT 15 is prevented by the gate electrode. The plurality of TFTs 15 are disposed not to overlap with the plurality of pixel electrodes 20 in the plan view.

As illustrated in FIGS. 1 and 2, the TFT substrate 2001 includes a plurality of coloring layers each overlapping with, in the plan view, two or more of the pixel electrodes 20 adjacent to each other in the X direction as one direction among the plurality of pixel electrodes 20. In the first preferred embodiment, the plurality of coloring layers are coloring layers in three colors including a R coloring layer 51 as a red coloring layer, a G coloring layer 61 as a green coloring layer, and a B coloring layer 71 as a blue coloring layer, in other words, are color filters in three primary colors. The coloring layers in three colors overlap with each three of the pixel electrodes 20 in a one-to-one relation. In FIG. 1, illustration of coloring layers of pixels at the right and left ends of FIG. 1 is partially omitted to avoid drawing complication.

The R coloring layers 51, the G coloring layers 61, and the B coloring layers 71 extend in the Y direction as the column direction of the above-described matrix and are periodically arrayed in the X direction as the row direction of the above-described matrix. Accordingly, the R coloring layers 51, the G coloring layers 61, and the B coloring layers 71 are arrayed in stripes. When not to be distinguished, the R coloring layers 51, the G coloring layers 61, and the B coloring layers 71 are also referred to as the "coloring layers 51, 61, and 71 in three colors" in the following description.

An end part of each R coloring layer 51 overlaps with an end part of the corresponding G coloring layer 61 in the plan view. Similarly, an end part of each G coloring layer 61 overlaps with an end part of the corresponding B coloring layer 71 in the plan view, and an end part of each R coloring layer 51 overlaps with an end part of the corresponding B coloring layer 71 in the plan view. Each end part is, for example, a part of the coloring layer, which is positioned outside of the corresponding pixel electrode 20.

Figure 3:
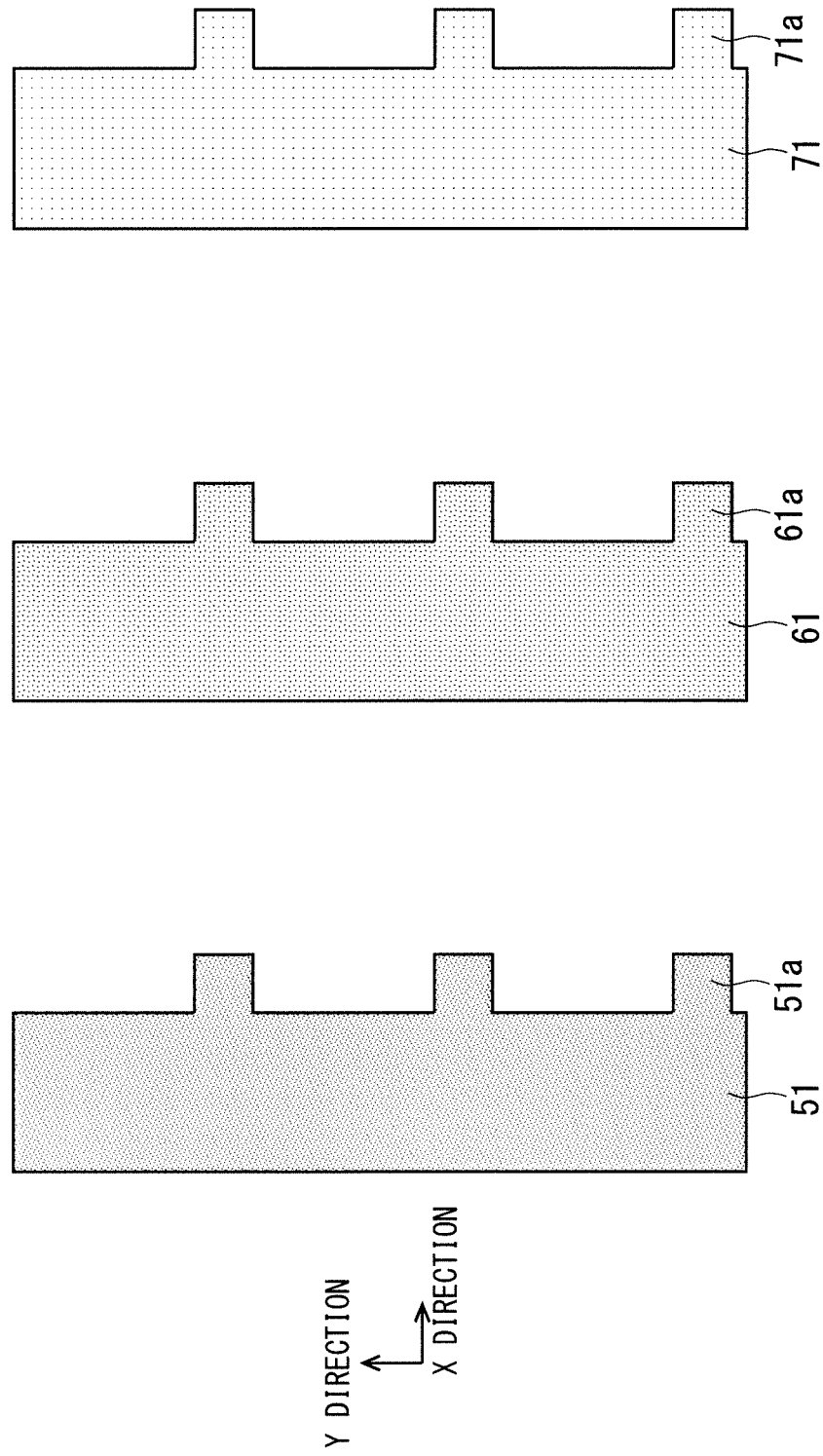
FIG. 3 is a plan view of a color filter pattern of the TFT substrate according to the first and third preferred embodiments of the present invention.

FIG. 3 is a plan view illustrating the shapes of the coloring layers 51, 61, and 71 in three colors. As illustrated in FIG. 3, the R coloring layer 51 includes, as the above-described end part of the R coloring layer 51, a protrusion pattern 51a bifurcating from the Y direction and protruding in the X direction. In the first preferred embodiment, the shapes of the G coloring layer 61 and the B coloring layer 71 are same as the shape of the R coloring layer 51, and thus similarly to the R coloring layer 51, the G coloring layer 61 and the B coloring layer 71 respectively include, as the above-described end parts of the G coloring layer 61 and the B coloring layer 71, protrusion patterns 61a and 71a bifurcating from the Y direction and protruding in the X direction.

As illustrated in FIGS. 1 and 2, an R-G light-shielding layer 2050 as a coloring laminated body includes the protrusion pattern 51a of the R coloring layer 51 and an end part of the G coloring layer 61 positioned relative to the R coloring layer 51 in the X direction, overlapping each other in the plan view. The R-G light-shielding layer 2050 is disposed to cover the TFT 15 electrically connected with the pixel electrode 20 overlapping with the G coloring layer 61 in the plan view, more specifically, an upper part of the channel layer of the TFT 15.

Similarly, a G-B light-shielding layer 2060 as a coloring laminated body includes a protrusion pattern 61a of the G coloring layer 61 and an end part of the B coloring layer 71 positioned relative to the G coloring layer 61 in the X direction, overlapping each other in the plan view. The G-B light-shielding layer 2060 is disposed to cover the TFT 15 electrically connected with the pixel electrode 20 overlapping with the B coloring layer 71 in the plan view, more specifically, an upper part of the channel layer of the TFT 15.

Similarly, an R-B light-shielding layer 2070 as a coloring laminated body includes a protrusion pattern 71a of the B coloring layer 71 and an end part of the R coloring layer 51 positioned relative to the B coloring layer 71 in the X direction, overlapping each other in the plan view. The R-B light-shielding layer 2070 is disposed to cover the TFT 15 electrically connected with the pixel electrode 20 overlapping with in the plan view the R coloring layer 51, more specifically, an upper part of the channel layer of the TFT 15.

As illustrated in FIG. 2, lowermost layers of the R-G light-shielding layer 2050, the G-B light-shielding layer 2060, and the R-B light-shielding layer 2070 are each the R coloring layer 51 or the G coloring layer 61. When not to be distinguished, the R-G light-shielding layer 2050, the G-B light-shielding layer 2060, and the R-B light-shielding layer 2070 also referred to as the "light-shielding layers 2050 to 2070" in the following description.

According to the first preferred embodiment configured as described above, since the R coloring layer 51, the G coloring layer 61, and the B coloring layer 71 include the protrusion patterns 51a, 61a, and 71a not separately nor independently provided therefrom, respectively, peeling due to insufficient adhesive force is unlikely to occur. In addition, the two-layer coloring laminated body, not a single-layer coloring layer, is disposed as a light-shielding layer above each TFT 15. Thus, when a pattern loss has occurred to one of two coloring layers included in one light-shielding layer, the other coloring layer can provide light shielding from above the TFT 15. This configuration can reduce generation of a pixel display defect attributable to characteristic degradation of a light-shielding defect.

According to the first preferred embodiment, the lowermost layer of each light-shielding layer is the R coloring layer 51 or the G coloring layer 61. Accordingly, a coloring layer nearest to the TFT 15 is the R coloring layer 51 or the G coloring layer 61 that blocks ultraviolet light having a wavelength of 400 nm or shorter. This configuration can further reduce generation of a pixel display defect attributable to characteristic degradation of a light-shielding defect in a display device provided with the TFTs 15 each including the channel layer made of oxide semiconductor.

The above-described configuration is achieved by the coloring layers 51, 61, and 71 in three colors having identical shapes. Thus, the same photoengraving mask can be used for patterning each coloring layer, thereby preventing increase of manufacturing cost.

<Manufacturing Method>

The following describes a method of manufacturing the TFT substrate 2001 according to the first preferred embodiment with reference to FIGS. 4 to 21. FIGS. 4, 6, 8, 10, 12, 14, 16, 18, and 20 are plane process diagrams illustrating the method of manufacturing the TFT substrate according to the first preferred embodiment. FIGS. 5, 7, 9, 11, 13, 15, 17, 19, and 21 are sectional process diagrams of sectional configurations taken along line X-X', line Y-Y', and line Z-Z' in the plane process diagram.

First, a substrate 1 as a transparent insulation substrate made of, for example, glass is cleaned by using cleaning liquid or pure water. In the first preferred embodiment, the substrate 1 is a glass substrate having a thickness of 0.6 mm. Then, a first conductive film as materials of the gate electrode 2, the gate wire 3, and the like is formed entirely on one of main surfaces of the cleaned substrate 1. One of the main surfaces of the substrate 1, on which the gate electrode 2, the gate wire 3, and the like are provided is referred to as an upper main surface of the substrate 1.

The first conductive film may be made of, for example, a metal such as chromium (Cr), molybdenum (Mo), titanium (Ti), copper (Cu), tantalum (Ta), tungsten (W), or aluminum (Al), or an alloy containing one of these metal elements as a primary component and additionally containing at least one other element. An element as the primary component is contained in a largest amount in an alloy among elements contained in the alloy. The first conductive film may have a laminated structure including two or more layers of these metals and alloys. The first conductive film having a low specific resistance value of 50 μΩ·cm or lower can be obtained by using these metals and alloys. In the first preferred embodiment, a Mo film having a thickness of 200 nm is formed as the first conductive film by sputtering using argon (Ar) gas.

Figure 4:
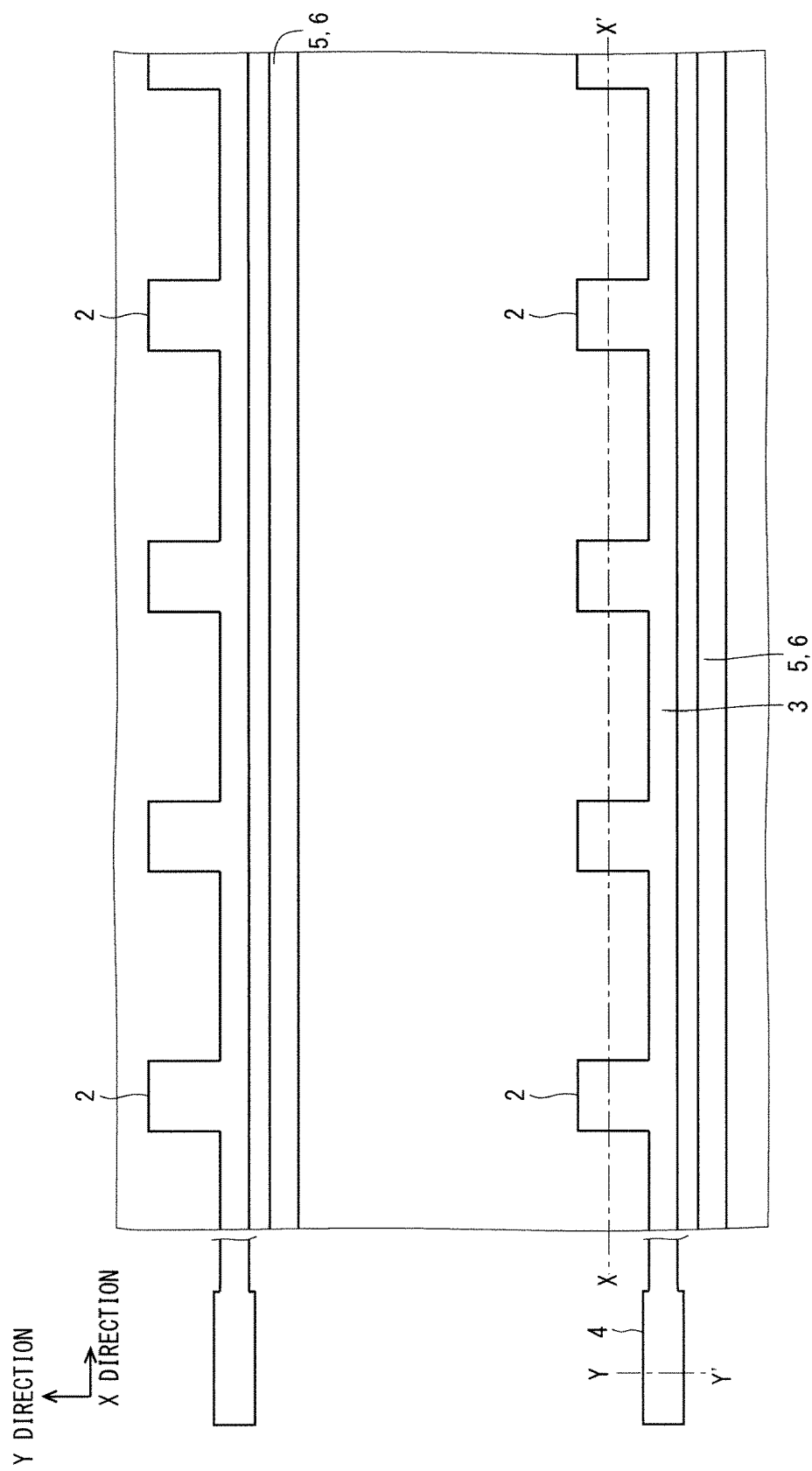
FIG. 4 is a plan view illustrating a method of manufacturing the TFT substrate according to the first and third preferred embodiments of the present invention.
Figure 5:
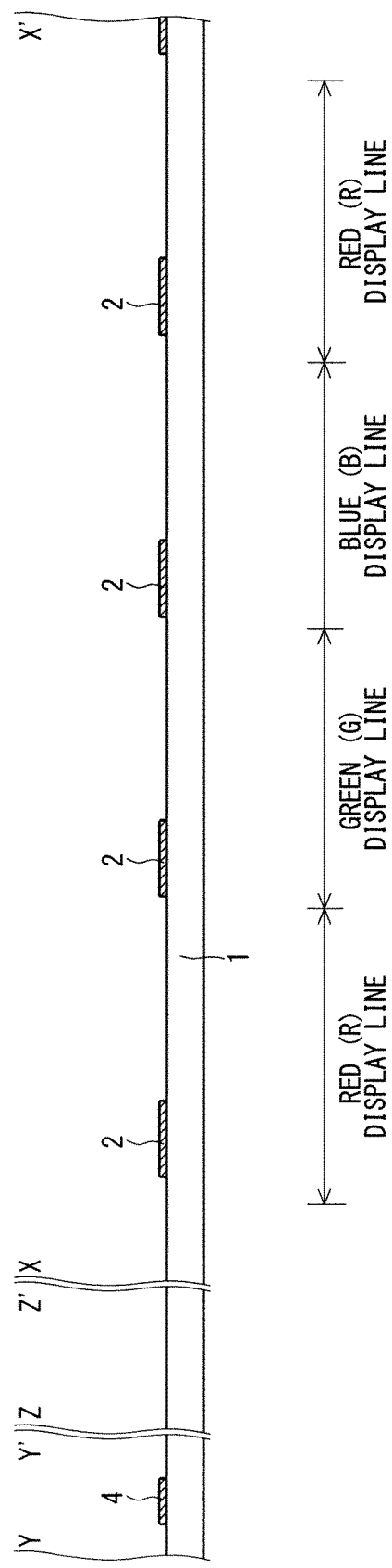
FIG. 5 is a cross-sectional view illustrating the method of manufacturing the TFT substrate according to the first and third preferred embodiments of the present invention.

Thereafter, a photoresist pattern is formed through the first photoengraving process by applying a photoresist material on the first conductive film, and then used as a mask to pattern the first conductive film by etching. In this example, wet etching is performed with solution (phosphoric-acetic-nitric acid or PAN drug solution) containing phosphoric acid, acetic acid, and nitric acid. Accordingly, as illustrated in FIGS. 4 and 5, the gate electrodes 2, the gate wires 3, gate terminals 4, common electrodes 5, and common electrode wires 6 are formed on the upper main surface of the substrate 1. Illustration of the photoresist pattern is omitted in FIGS. 4 and 5 and also in the following drawings. After the gate electrodes 2 and the like are formed, the photoresist pattern (not illustrated) is removed. Each gate electrode 2 is formed as part of the corresponding gate wire 3. Specifically, each gate electrode 2 is formed as part of the corresponding gate wire 3 extending in the X direction, which bifurcates from the gate wire 3 and protrudes into a TFT formation region. Each gate terminal 4 is disposed at an end part of the corresponding gate wire 3.

Subsequently, a first insulation film as a material of a gate insulation film 7 is formed on the entire upper main surface of the substrate 1 to cover the gate electrodes 2, the gate wires 3, the gate terminals 4, and the like, and then an oxide semiconductor film as a material of a semiconductor channel layer 15a of the TFT 15 is formed. The oxide semiconductor film and the oxide semiconductor layer are effectively same.

In the first preferred embodiment, the first insulation film is formed by forming a silicon nitride (SiN) film and an oxide silicon (SiO) film in this order through chemical vapor deposition (CVD). The SiO film contains oxygen (O) atoms and thus can reduce influence due to diffusion (discharge) of O atoms from the oxide semiconductor film to a layer therebelow when the oxide semiconductor film is formed on the first insulation film through the following process. The SiO film has a weak barrier property (shielding property) against impurity elements such as water ($H_2O$), hydrogen ($H_2$), sodium (Na), and potassium (K), which affect a TFT characteristic. For this reason, in the first preferred embodiment, for example, a SiN film having an excellent barrier property is provided below the SiO film. Specifically, a laminated structure composed of a SiN film having a thickness of 400 nm and a SiO film having a thickness of 50 nm is formed as the first insulation film. This first insulation film functions as the gate insulation film 7 in the TFT 15.

In the first preferred embodiment, an oxide containing In, Ga, and Zn, such as InGaZnO is employed as the oxide semiconductor film formed on the first insulation film. Specifically, an amorphous InGaZnO film having a thickness of 50 nm is formed by sputtering using an InGaZnO target [$In_2O_3 \cdot Ga_2O_3 \cdot (ZnO)_2$] having a In:Ga:Zn:O atom composition ratio of 1:1:1:4.

Figure 6:
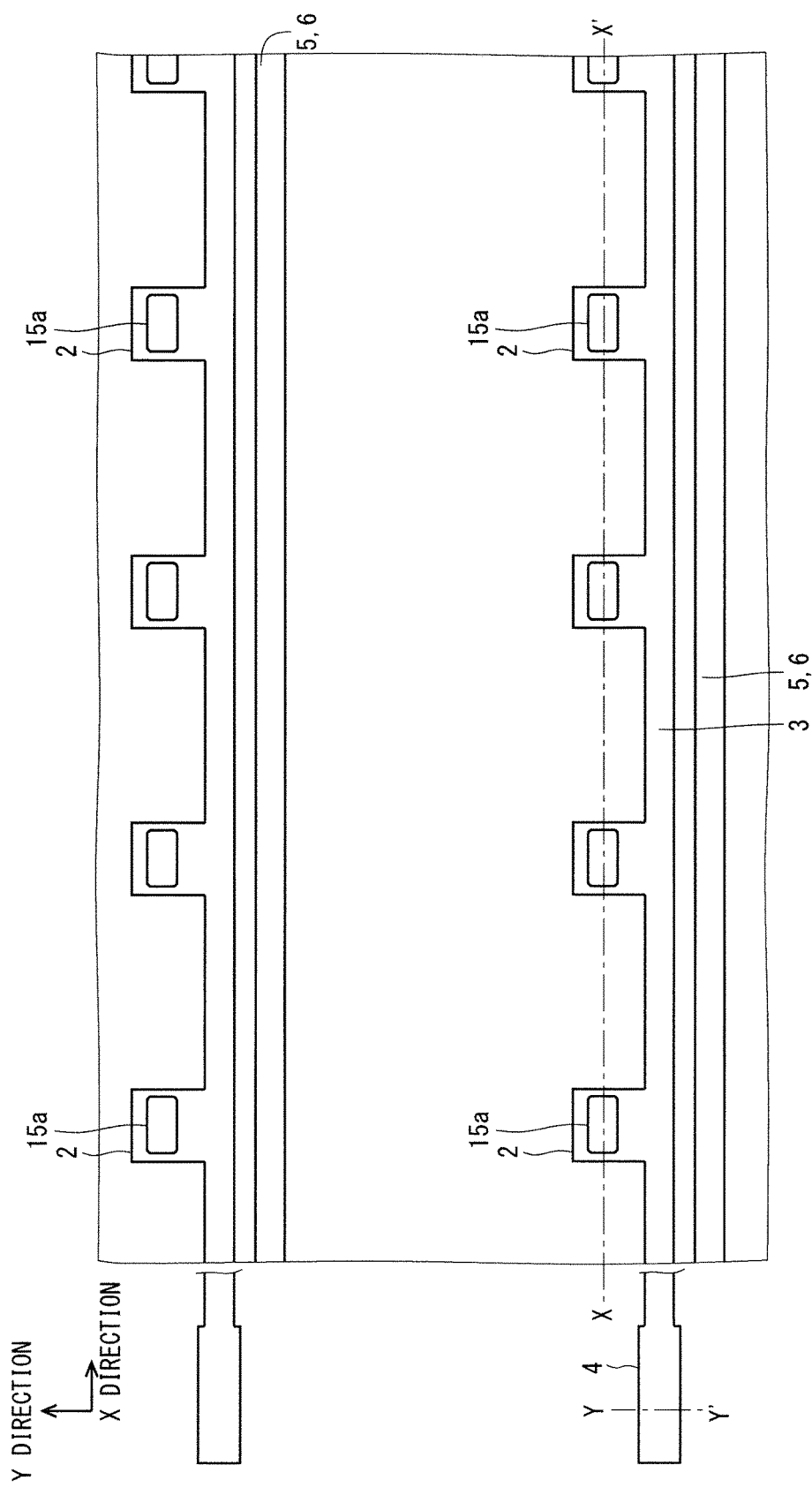
FIG. 6 is a plan view illustrating the method of manufacturing the TFT substrate according to the first and third preferred embodiments of the present invention.
Figure 7:
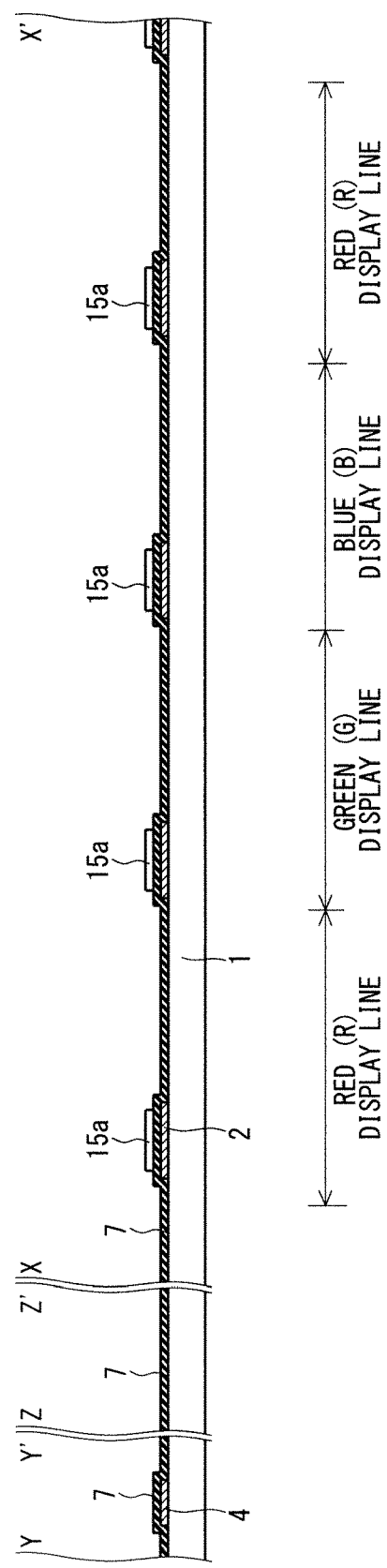
FIG. 7 is a cross-sectional view illustrating the method of manufacturing the TFT substrate according to the first and third preferred embodiments of the present invention.

Thereafter, a photoresist pattern is formed through the second photoengraving process and then used as a mask to pattern the oxide semiconductor film by etching. In this example, wet etching is performed with solution containing oxalic acid (dicarboxylic acid). Accordingly, as illustrated in FIGS. 6 and 7, the plurality of semiconductor channel layers 15a as the channel layers of respective TFTs 15 are formed on the gate insulation film 7 as the first insulation film so that the semiconductor channel layers 15a overlap with the plurality of gate electrodes 2 in the plan view. Thereafter, the photoresist pattern (not illustrated) is removed.

Subsequently, a second insulation film as a material of a channel protective film 107 is formed on the entire upper main surface of the substrate 1 including the semiconductor channel layer 15a. In the first preferred embodiment, the second insulation film is obtained by forming a SiO film having a thickness of 100 nm through the CVD.

Figure 8:
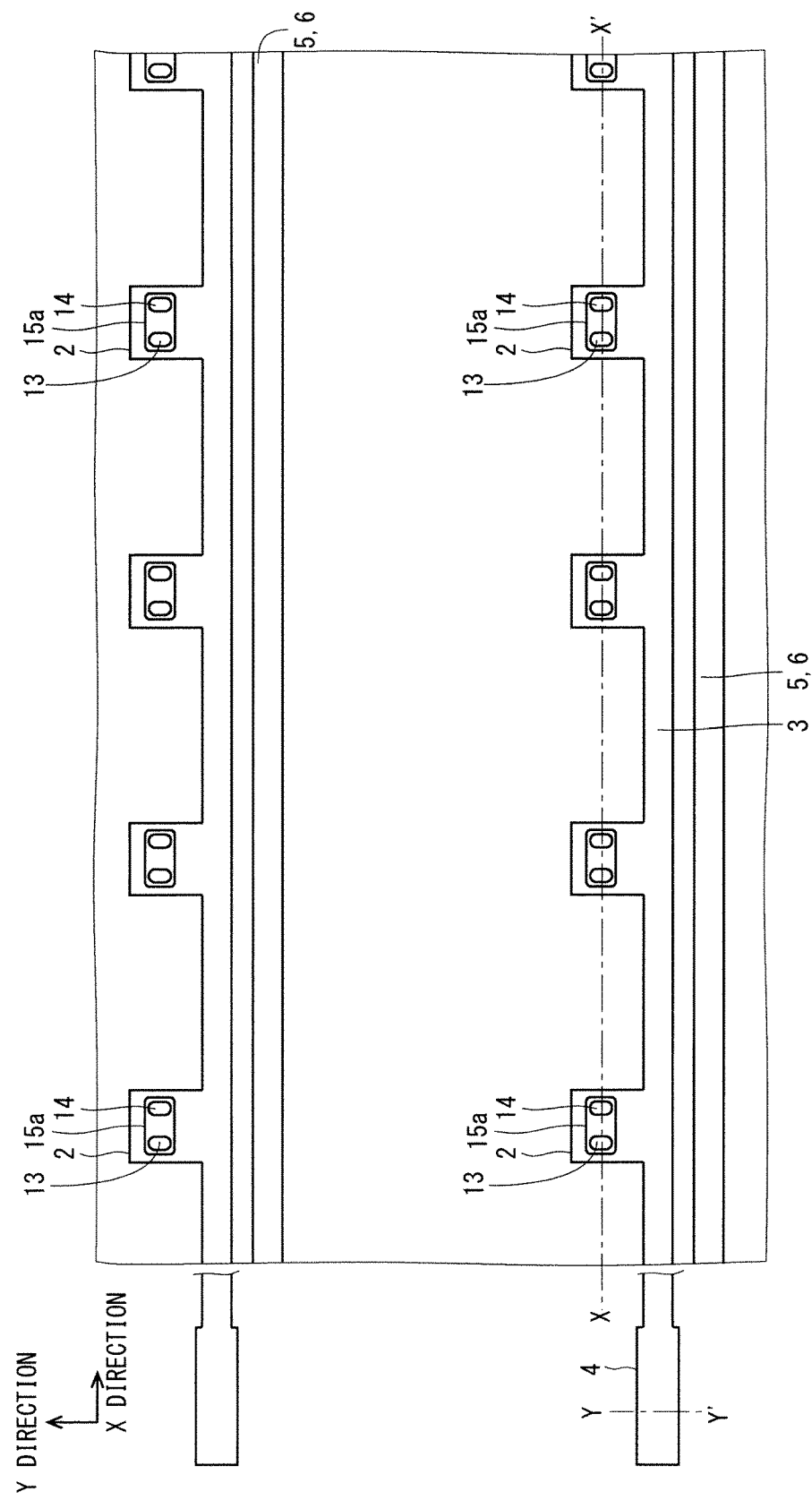
FIG. 8 is a plan view illustrating the method of manufacturing the TFT substrate according to the first and third preferred embodiments of the present invention.
Figure 9:
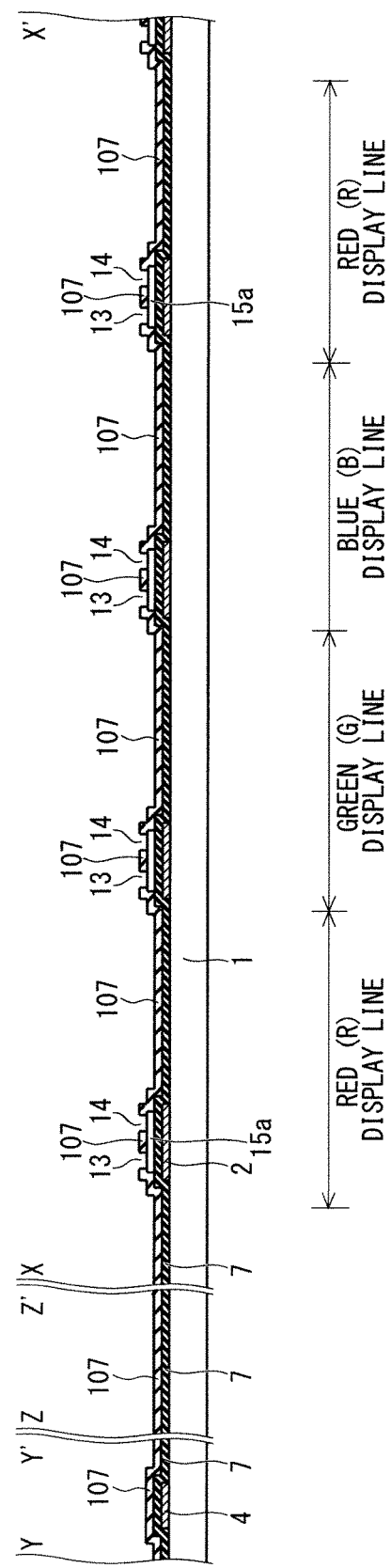
FIG. 9 is a cross-sectional view illustrating the method of manufacturing the TFT substrate according to the first and third preferred embodiments of the present invention.

Thereafter, a photoresist pattern is formed through the third photoengraving process and then used as a mask to pattern the second insulation film by etching. In this example, dry etching is performed with gas of sulfur hexafluoride ($SF_6$) with addition of oxygen ($O_2$). Accordingly, as illustrated in FIGS. 8 and 9, a source electrode contact hole 13 and a drain electrode contact hole 14 are formed in the second insulation film on the semiconductor channel layer 15a. Thereafter, the photoresist pattern (not illustrated) is removed.

A region on the semiconductor channel layer 15a, in which the source electrode contact hole 13 and the drain electrode contact hole 14 are not formed and that is covered by the second insulation film functions as the channel protective film 107 protecting a semiconductor channel part from any process damage through the following process.

Subsequently, a second conductive film as materials of a source electrode 8, a source wire 9, a drain electrode 11, and the like is formed on the entire upper main surface of the substrate 1 including the channel protective film 107.

The second conductive film may be made of, for example, a metal such as Cr, Mo, Ti, Cu, Ta, W, or Al, or an alloy containing one of these metal elements as a primary component and additionally containing at least one other element. An element as the primary component is contained in a largest amount in an alloy among elements contained in the alloy. The second conductive film may have a laminated structure including two or more layers of these metals and alloys. The second conductive film having a low specific resistance value of 50 μΩ·cm or lower can be obtained by using these metals and alloys. In the first preferred embodiment, a Mo film having a thickness of 200 nm is formed as the second conductive film by sputtering using Ar gas.

Figure 10:
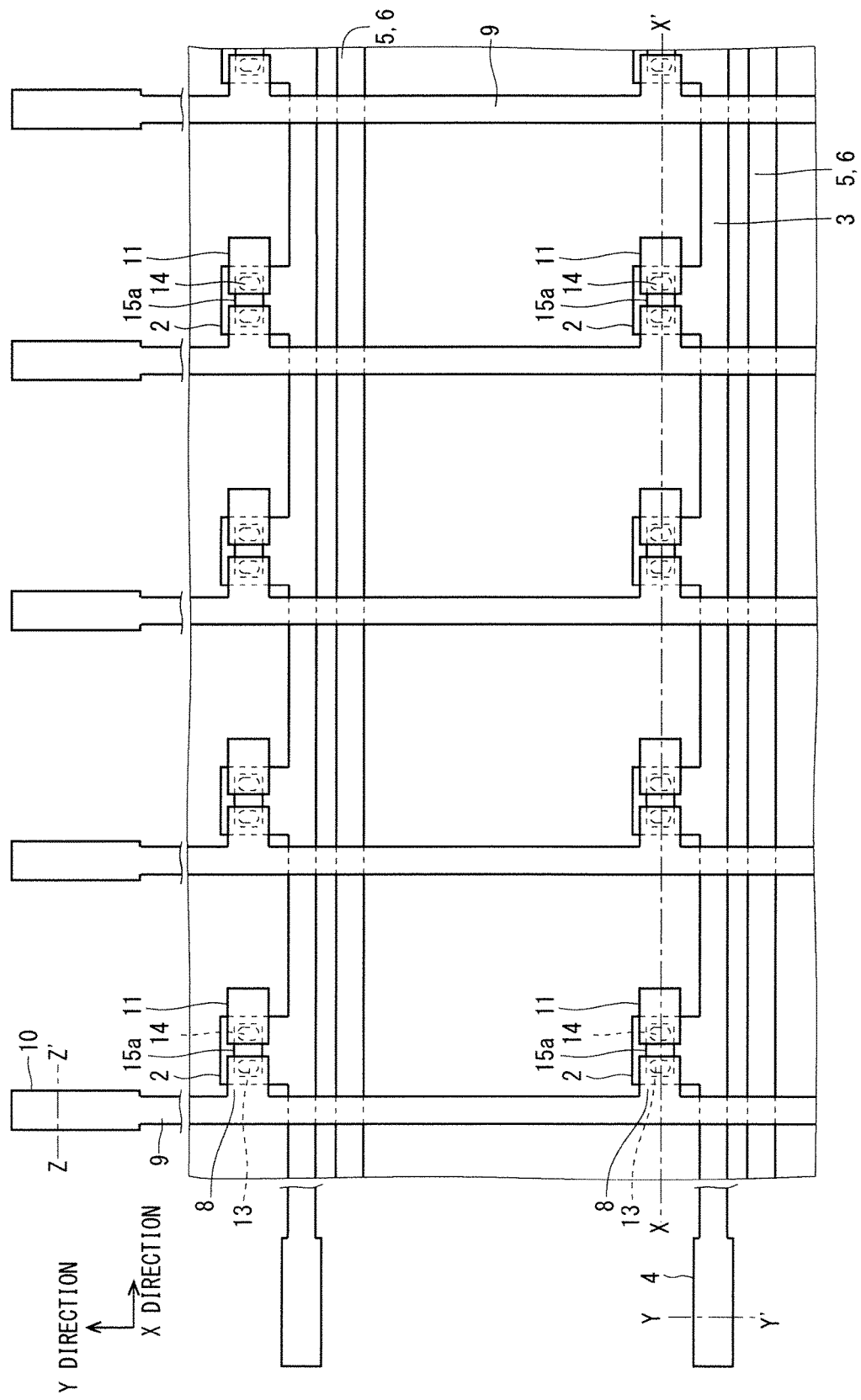
FIG. 10 is a plan view illustrating the method of manufacturing the TFT substrate according to the first and third preferred embodiments of the present invention.
Figure 11:
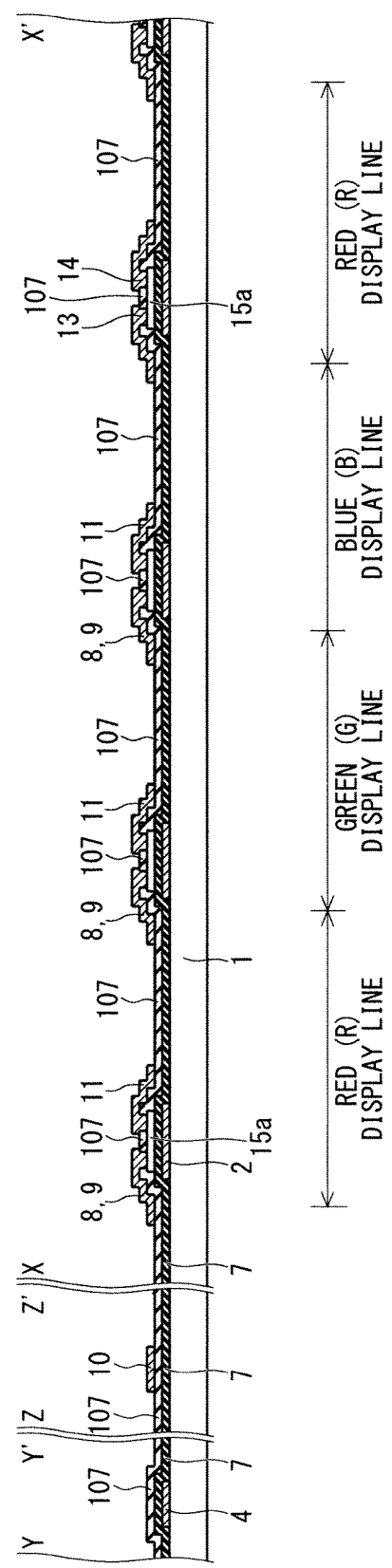
FIG. 11 is a cross-sectional view illustrating the method of manufacturing the TFT substrate according to the first and third preferred embodiments of the present invention.

Thereafter, a photoresist pattern is formed through the fourth photoengraving process and then used as a mask to pattern the second conductive film by etching. In this example, wet etching is performed with PAN drug solution. Accordingly, as illustrated in FIGS. 10 and 11, the source electrode 8, the source wire 9, a source terminal 10, and the drain electrode 11 are formed. Thereafter, the photoresist pattern (not illustrated) is removed.

The source electrode 8 is directly connected with the semiconductor channel layer 15a therebelow through the source electrode contact hole 13. The source electrode 8 is formed as part of the source wire 9. In other words, the source electrode 8 is formed as part of the source wire 9 extending in the Y direction, which bifurcates from the source wire 9 and protrudes into a TFT formation region. With this configuration, the plurality of semiconductor channel layers 15a are electrically connected with the plurality of respective source wires 9 through the plurality of source electrodes 8. The plurality of source wires 9 intersect with the plurality of gate wires 3 in the plan view while being insulated from the plurality of gate wires 3 by the gate insulation film 7.

The source terminal 10 is disposed at an end part of the source wire 9. The drain electrode 11 is directly connected with the semiconductor channel layer 15a therebelow through the drain electrode contact hole 14.

Subsequently, a third insulation film as a protection insulation film 207 is formed on the entire upper main surface of the substrate 1. In the first preferred embodiment, the third insulation film is obtained by forming a SiN film having a thickness of 100 nm through the CVD.

Following the formation of the third insulation film, the R coloring layers 51, the G coloring layers 61, and the B coloring layers 71 arrayed in a matrix and adjacent to each other in one direction are formed. The R coloring layers 51, the G coloring layers 61, and the B coloring layers 71 are formed in the order of the R coloring layer 51, the G coloring layer 61, and the B coloring layer 71.

Specifically, a coloring material as a material of each R coloring layer 51 is formed on the entire upper main surface of the substrate 1. In the first preferred embodiment, a layer of a red coloring material having a thickness of 1.5 μm is formed by a color resist method. In the color resist method, a colored photosensitive material obtained by uniformly dispersing refined red pigment in a light-sensitive resin is applied and formed by spin coating. The colored photosensitive material may be a polyvinyl alcohol photocrosslinking type or an acrylic resin photopolymerization type.

Figure 12:
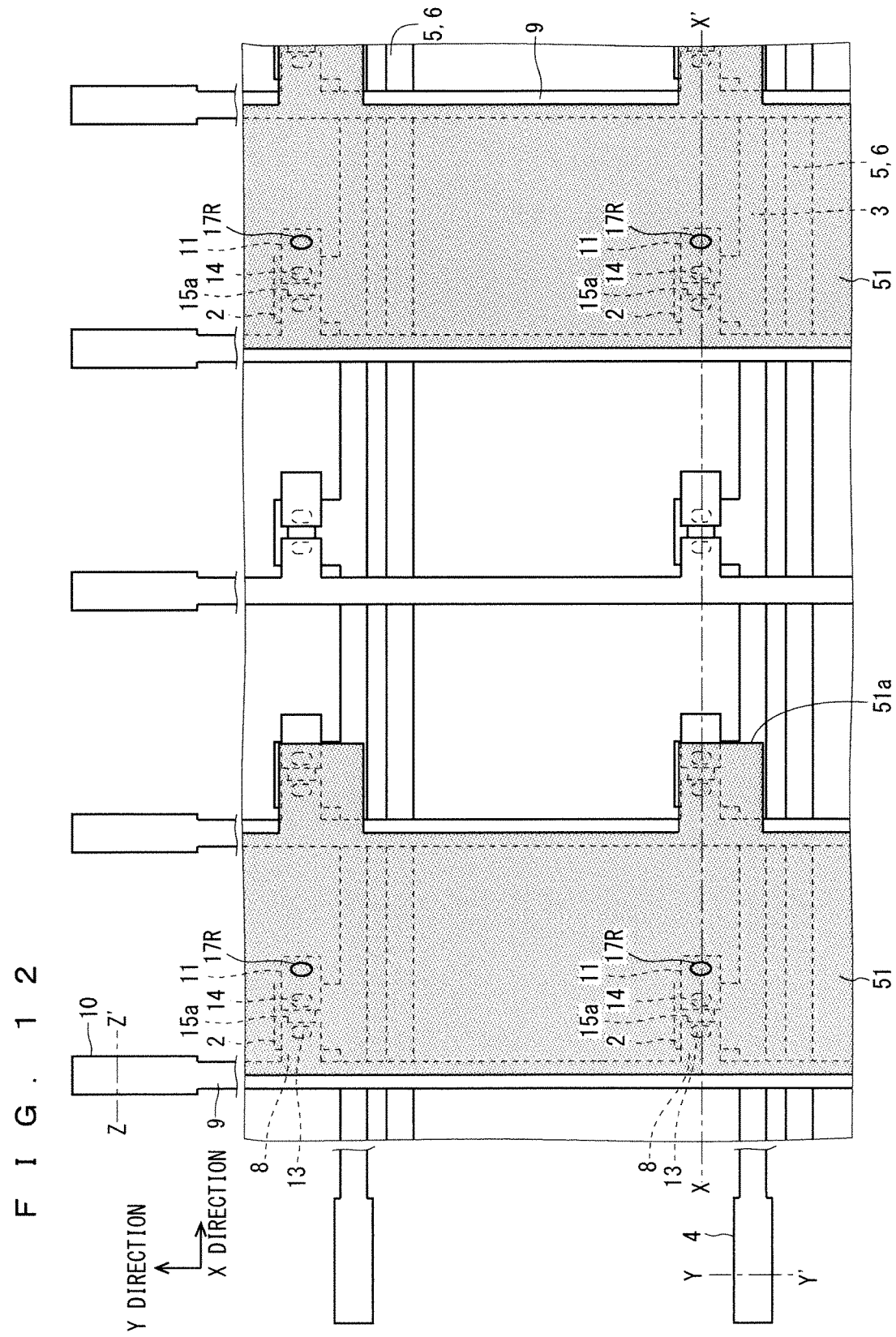
FIG. 12 is a plan view illustrating the method of manufacturing the TFT substrate according to the first and third preferred embodiments of the present invention.
Figure 13:
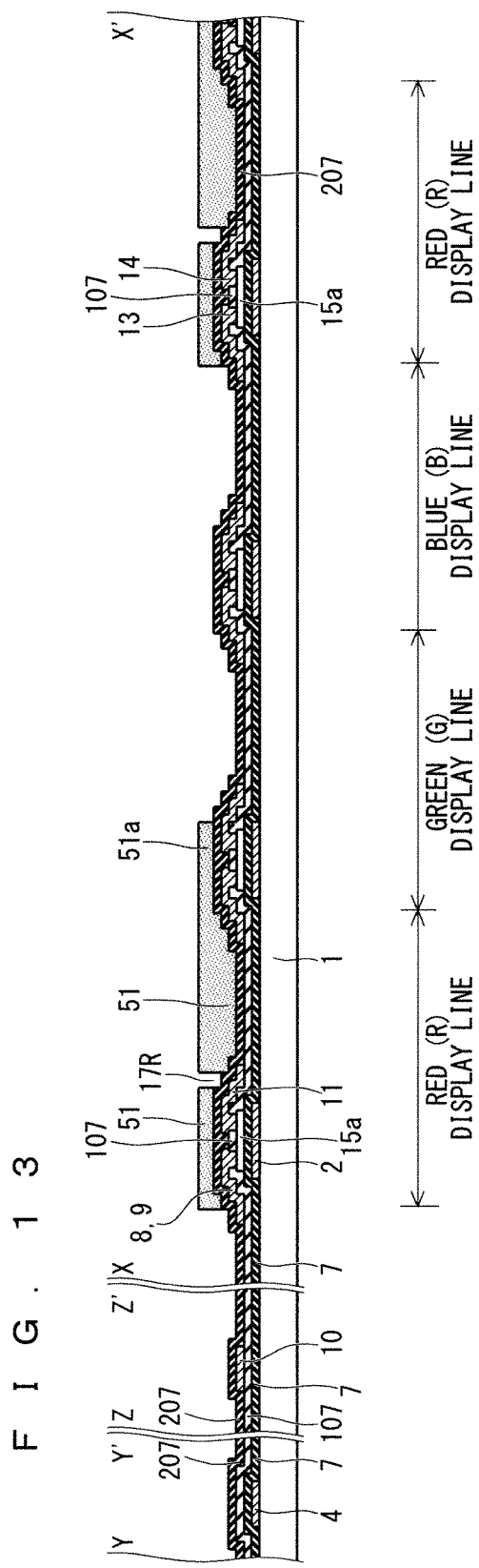
FIG. 13 is a cross-sectional view illustrating the method of manufacturing the TFT substrate according to the first and third preferred embodiments of the present invention.

Thereafter, the red colored photosensitive material is patterned by exposure and development through the fifth photoengraving process. Accordingly, as illustrated in FIGS. 12 and 13, the R coloring layer 51 is formed in a stripe shape extending in the Y direction, and the protrusion pattern 51a is formed as a channel light-shielding layer bifurcating from the Y direction to the X direction. A pixel drain contact hole 17R is formed above the drain electrode 11 of the R coloring layer 51.

Subsequently, a coloring material as a material of each G coloring layer 61 is formed on the entire upper main surface of the substrate 1. In the first preferred embodiment, a green coloring layer having a thickness of 1.5 μm is formed of a material same as that of the red coloring layer by the color resist method.

Figure 14:
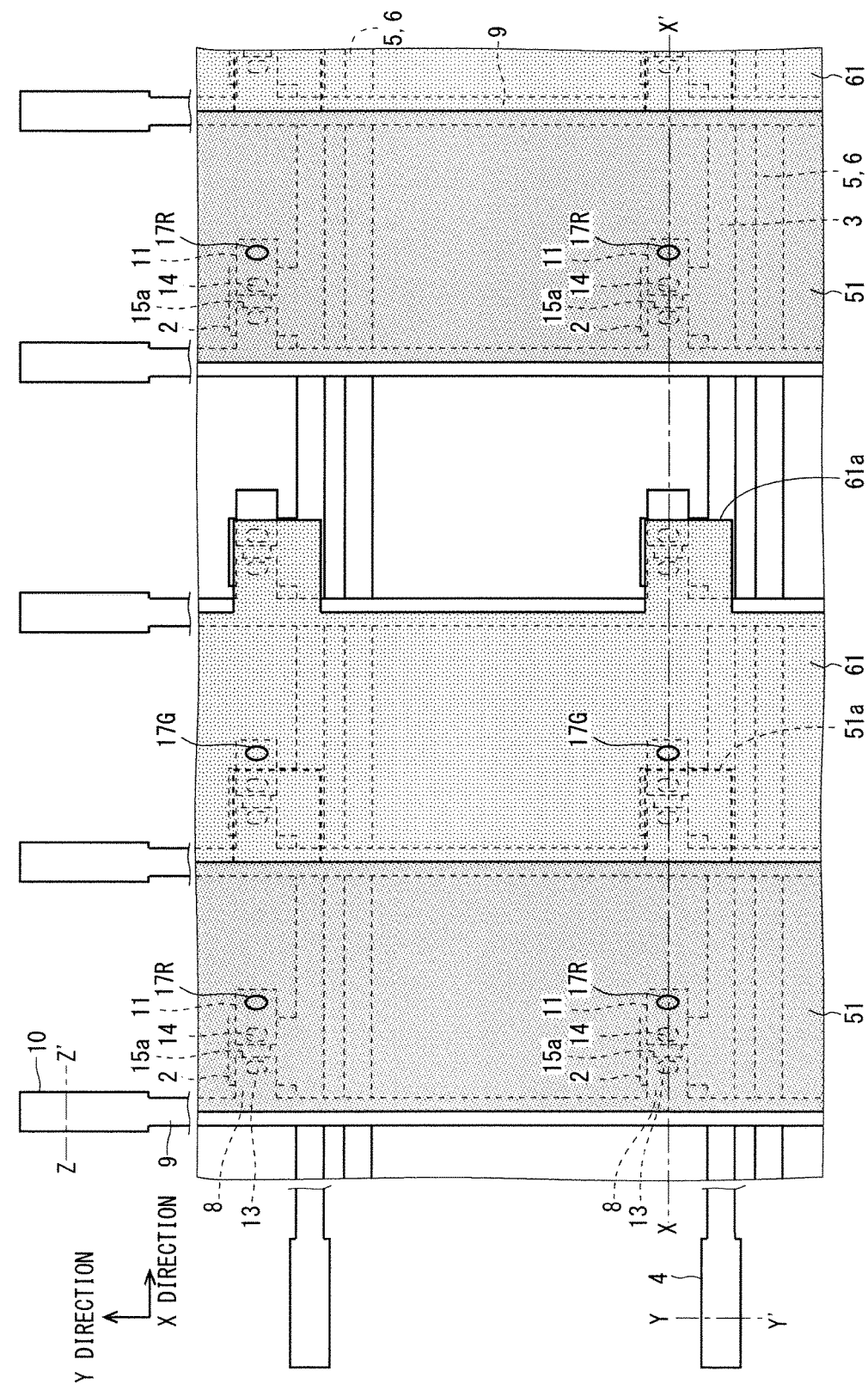
FIG. 14 is a plan view illustrating the method of manufacturing the TFT substrate according to the first and third preferred embodiments of the present invention.
Figure 15:
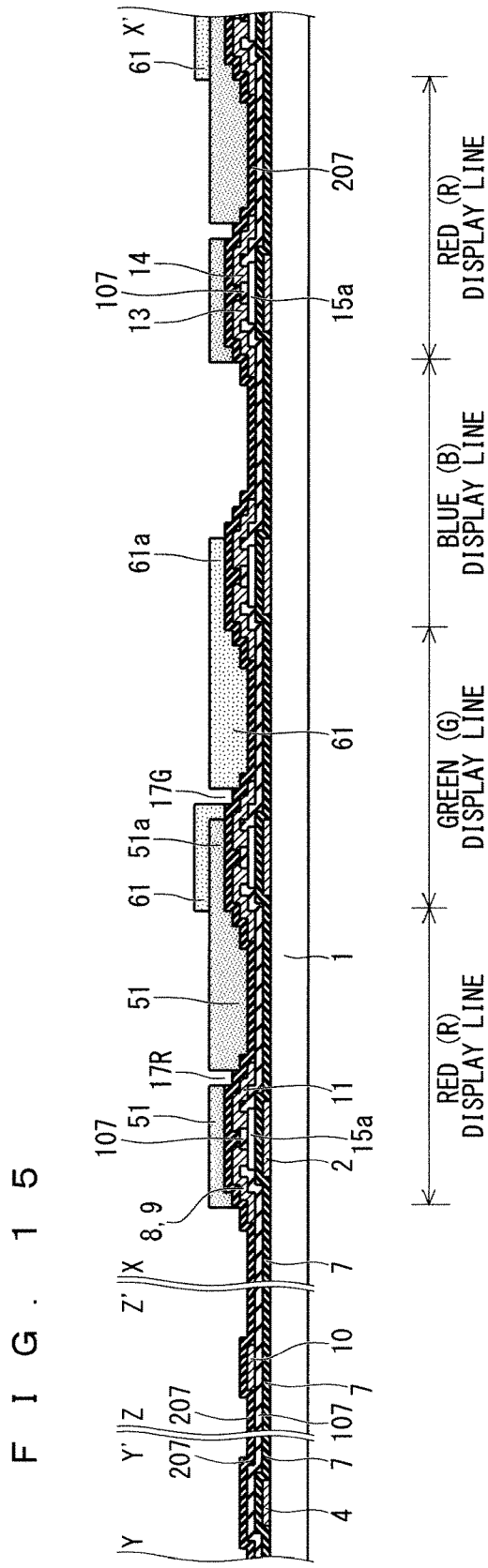
FIG. 15 is a cross-sectional view illustrating the method of manufacturing the TFT substrate according to the first and third preferred embodiments of the present invention.

Thereafter, the green colored photosensitive material is patterned by exposure and development through the sixth photoengraving process. Accordingly, as illustrated in FIGS. 14 and 15, the G coloring layer 61 is formed in a stripe shape extending in the Y direction, and the protrusion pattern 61a is formed as a channel light-shielding layer bifurcating from the Y direction to the X direction. A pixel drain contact hole 17G is formed above the drain electrode 11 of the G coloring layer 61.

The R-G light-shielding layer 2050 (FIG. 2) including the protrusion pattern 51a of the R coloring layer 51 as a lower layer and the end part of the G coloring layer 61 as an upper layer is formed above the semiconductor channel layer 15a of the TFT 15 corresponding to each G coloring layer 61 in a green display line.

Subsequently, a coloring material as a material of each B coloring layer 71 is formed on the entire upper main surface of the substrate 1. In the first preferred embodiment, a blue coloring layer having a thickness of 1.5 μm is formed of a material same as that of the red coloring layer by the color resist method.

Figure 16:
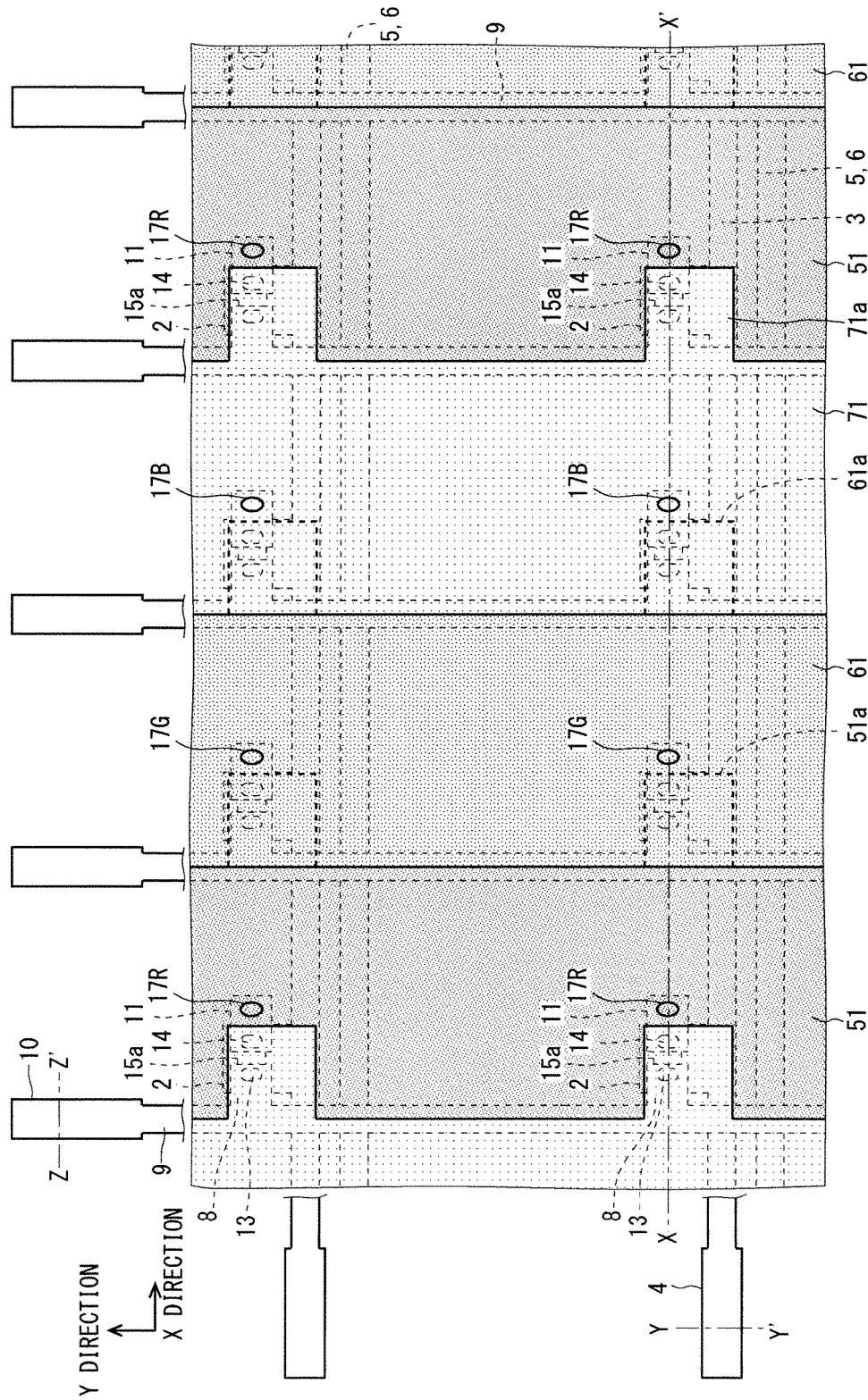
FIG. 16 is a plan view illustrating the method of manufacturing the TFT substrate according to the first and third preferred embodiments of the present invention.
Figure 17:
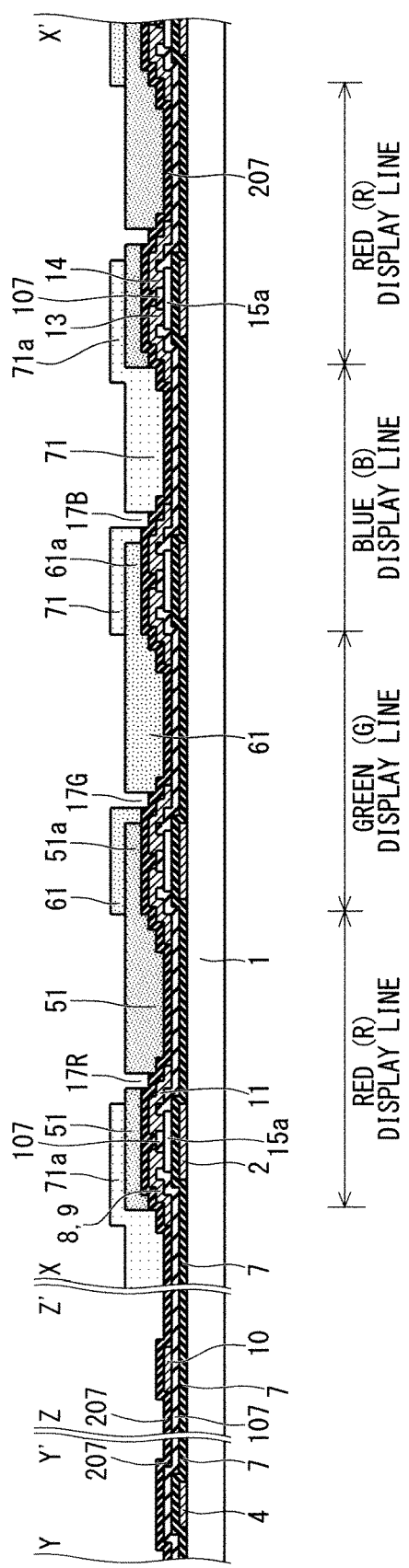
FIG. 17 is a cross-sectional view illustrating the method of manufacturing the TFT substrate according to the first and third preferred embodiments of the present invention.

Thereafter, the blue colored photosensitive material is patterned by exposure and development through the seventh photoengraving process. Accordingly, as illustrated in FIGS. 16 and 17, the B coloring layer 71 is formed in a stripe shape extending in the Y direction, and the protrusion pattern 71a is formed as a channel light-shielding layer bifurcating from the Y direction to the X direction. A pixel drain contact hole 17B is formed above the drain electrode 11 of the B coloring layer 71.

The G-B light-shielding layer 2060 (FIG. 2) including the protrusion pattern 61a of the G coloring layer 61 as a lower layer and the end part of the B coloring layer 71 as an upper layer is formed above the semiconductor channel layer 15a of the TFT 15 corresponding to each B coloring layer 71 in a blue display line.

The R-B light-shielding layer 2070 (FIG. 2) including the end part of the R coloring layer 51 as a lower layer and the protrusion pattern 71a of the B coloring layer 71 as an upper layer is formed above the semiconductor channel layer 15a of the TFT 15 corresponding to each R coloring layer 51 in a red display line.

Subsequently, a photoresist pattern is formed through the eighth photoengraving process and then used as a mask to form the gate insulation film 7, the channel protective film 107, and the protection insulation film 207 by etching. In this example, dry etching is performed with gas of $SF_6$ with addition of $O_2$. Thereafter, the photoresist pattern (not illustrated) is removed.

Figure 18:
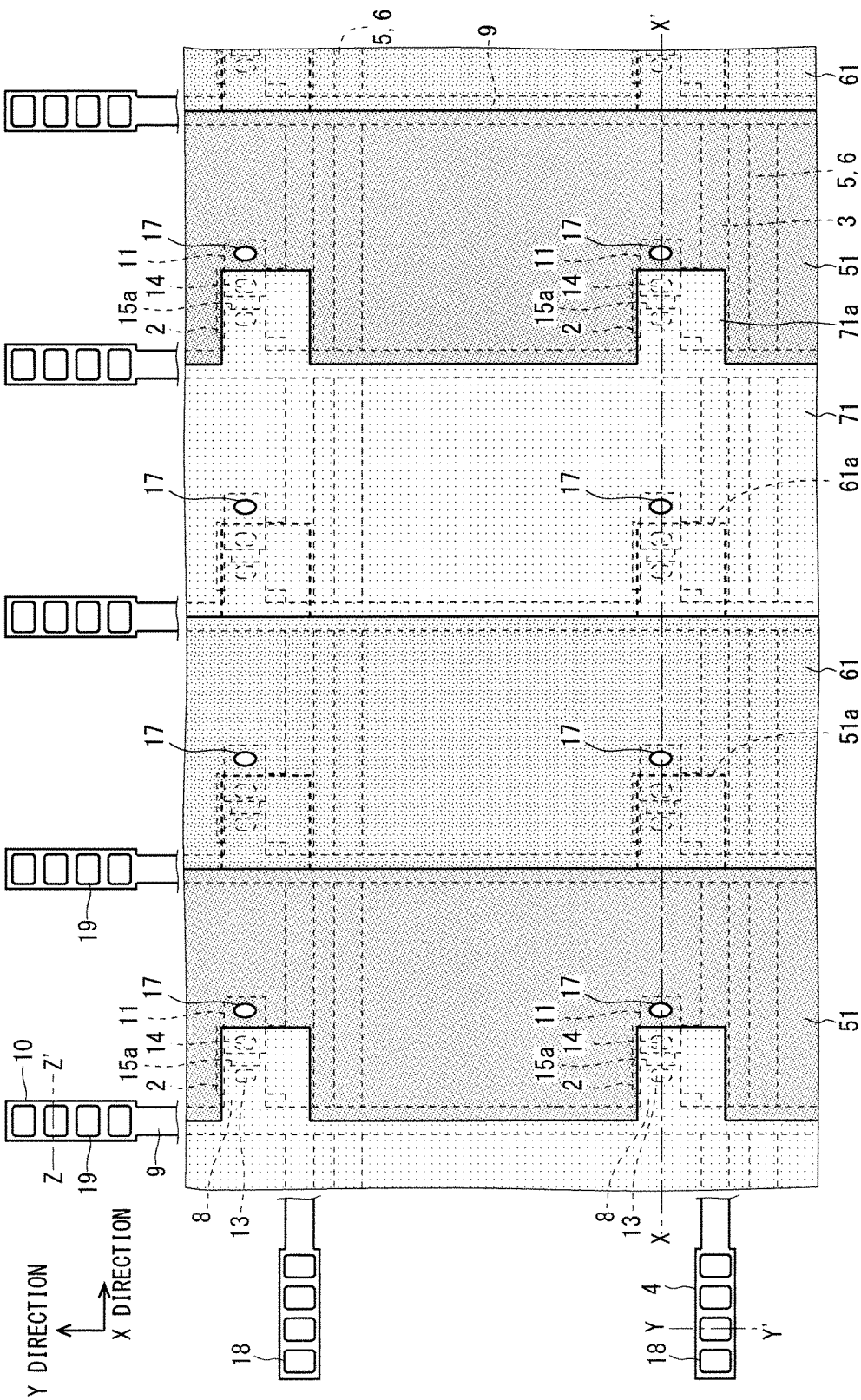
FIG. 18 is a plan view illustrating a method of manufacturing a TFT substrate according to a first preferred embodiment of the present invention.
Figure 19:
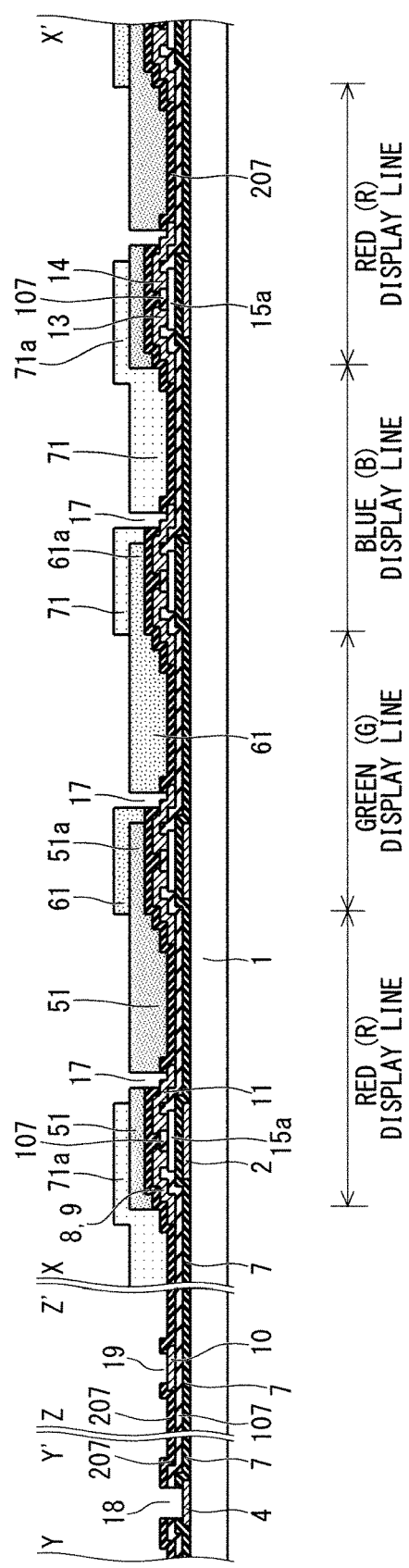
FIG. 19 is a cross-sectional view illustrating the method of manufacturing the TFT substrate according to the first preferred embodiment of the present invention.

Through the formation of the gate insulation film 7, the channel protective film 107, and the protection insulation film 207, a pixel drain contact hole 17 is formed above the drain electrode 11, a gate terminal contact hole 18 is formed above the gate terminal 4, a source terminal contact hole 19 is formed above the source terminal 10 as illustrated in FIGS. 18 and 19.

The pixel drain contact holes 17 are formed at positions corresponding to the pixel drain contact holes 17R, 17G, and 17B of the R coloring layer 51, the G coloring layer 61, and the B coloring layer 71. Each pixel drain contact hole 17 penetrates through the protection insulation film 207 and any one of the R coloring layer 51, the G coloring layer 61, and the B coloring layer 71 so that the drain electrode 11 is exposed. The gate terminal contact hole 18 penetrates through the protection insulation film 207, the channel protective film 107, and the gate insulation film 7 so that the gate terminal 4 is exposed. The source terminal contact hole 19 penetrates through the protection insulation film 207 so that the source terminal 10 is exposed.

The dry etching with the above-described gas of $SF_6$ with addition of $O_2$ etches the SiN film and the SiO film as materials of the gate insulation film 7, the channel protective film 107, and the protection insulation film 207, but not the first conductive film and the second conductive film made of the metals and alloys as materials of the gate terminal 4, the source terminal 10, and the drain electrode 11. Thus, the etching stops substantially when the first conductive film and the second conductive film are exposed on bottom surfaces of the corresponding contact holes. Accordingly, the pixel drain contact hole 17, the gate terminal contact hole 18, and the source terminal contact hole 19 can be simultaneously formed through single dry etching.

Subsequently, a third conductive film is formed on the entire upper main surface of the substrate 1 including the coloring layers 51, 61, and 71 in three colors. In the first preferred embodiment, the third conductive film is a transparent conductive film having a translucent property. Examples of the transparent conductive film include an ITO film made of indium oxide ($In_2O_3$) and tin oxide ($SnO_2$) in a mixture ratio of 90:1 in wt %. In this example, an ITO film having a thickness of 100 nm is formed in an amorphous state by sputtering using gas including a hydrogen (H) containing gas such as hydrogen ($H_2$) gas or steam ($H_2O$) with argon (Ar).

Then, a photoresist pattern is formed of a photoresist material applied on the entire surface of the third conductive film, which is the amorphous ITO film, through the ninth photoengraving process and then used as a mask to pattern the third conductive film by etching. The third conductive film is etched by wet etching with solution containing oxalic acid (dicarboxylic acid). Thereafter, the photoresist pattern (not illustrated) is removed.

Figure 20:
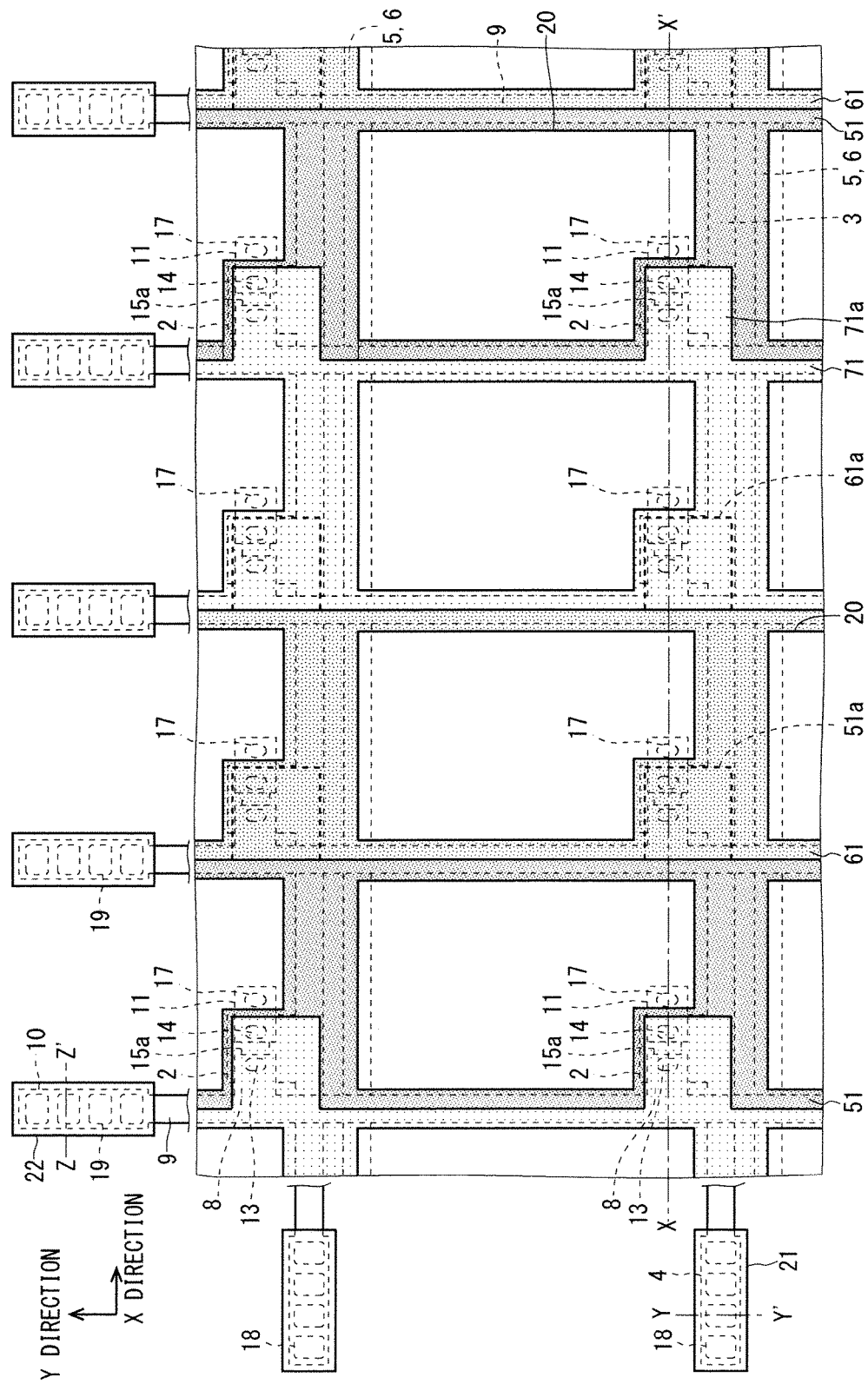
FIG. 20 is a plan view illustrating the method of manufacturing the TFT substrate according to the first preferred embodiment of the present invention.
Figure 21:
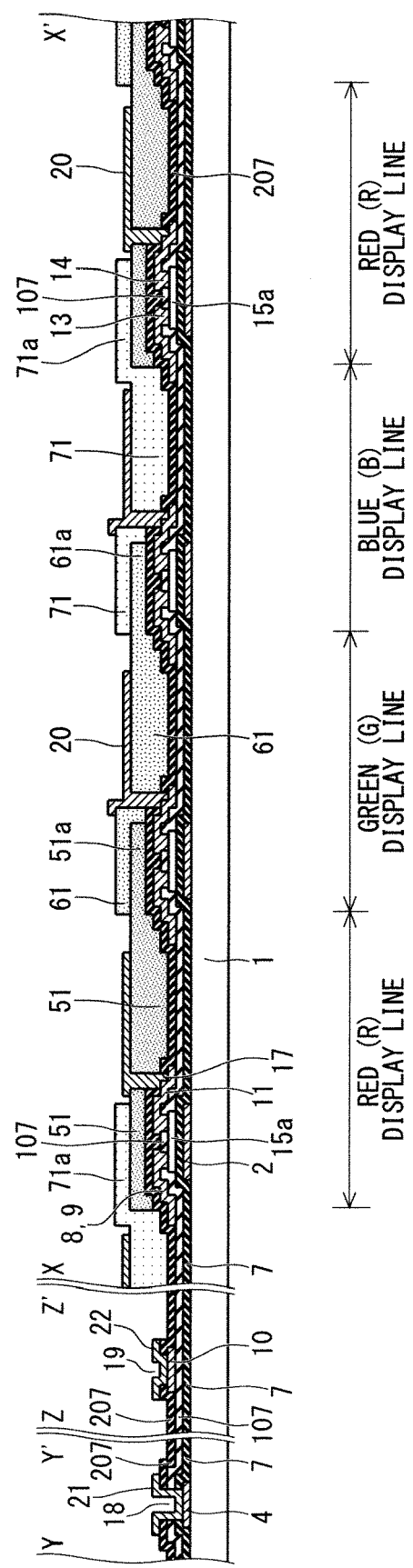
FIG. 21 is a cross-sectional view illustrating the method of manufacturing the TFT substrate according to the first preferred embodiment of the present invention.

Subsequently, the entire substrate 1 is heated to 200° C. so that the amorphous ITO film is crystallized into a polycrystalline ITO film, and as a result, the pixel electrode 20, a gate terminal pad 21, and a source terminal pad 22 are formed as illustrated in FIGS. 20 and 21. This heating temperature is not limited to 200° C. For example, a typical amorphous ITO film having a mixture ratio of indium oxide ($In_2O_3$) of 85% to 95% inclusive and tin oxide ($SnO_2$) of 5% to 15% inclusive, which are summed to 100% in wt %, can be crystallized at 140° C. or higher. The polycrystalline ITO film leads to improved resistance of the pixel electrode 20, the gate terminal pad 21, and the source terminal pad 22 against drug solution, thereby preventing influence of any process damage at later assembly of a liquid crystal display panel.

The TFT substrate 2001 illustrated in FIGS. 1 and 2 is completed through the above-described process. At the assembly of a liquid crystal display panel, first, an alignment film and a spacer are formed on an upper surface of the TFT substrate 2001 illustrated in FIGS. 1 and 2. The alignment film is a film for arraying liquid crystals and made of, for example, polyimide. Subsequently, a counter substrate (not illustrated) separately produced and including, for example, a counter electrode and an alignment film is bonded to the TFT substrate 2001 through the above-described spacer and the like.

The spacer forms a gap between the TFT substrate 2001 and the counter substrate. The spacer may be formed by spraying powder of, for example, spherical silica, but in the first preferred embodiment, is a column-shaped spacer (not illustrated). The column-shaped spacer is formed by applying, for example, organic photosensitive resin by spin coating and exposing and developing the resin through a photoengraving process. This method can form the column-shaped spacer in a desired shape at a desired position. The height of the column-shaped spacer, more specifically, the distance between the TFT substrate 2001 and the counter substrate can be set through the film thickness of the photosensitive resin.

In the first preferred embodiment, the column-shaped spacer is formed on, for example, the light-shielding layers 2050 to 2070. In this case, the light-shielding layers 2050 to 2070 each function as a base of the column-shaped spacer. With this configuration, for example, the R-G light-shielding layer 2050 having relatively excellent flatness can be used as the base of the column-shaped spacer to sufficiently provide the strength of the column-shaped spacer, thereby reliably forming the column-shaped spacer. The light-shielding layers 2050 to 2070 as coloring laminated bodies are higher than any other component, and thus the photosensitive resin for forming the column-shaped spacer can be applied in a smaller film thickness. As a result, productivity is expected to be increased.

The column-shaped spacers may be disposed on all light-shielding layers 2050 to 2070 or may be disposed, for example, at every predetermined number of the light-shielding layers 2050 to 2070 disposed in a matrix. Typically, after an alignment film is formed, liquid crystal molecules are aligned in a certain direction by, for example, rubbing, but regions of the alignment film near the column-shaped spacers cannot be rubbed. However, when the column-shaped spacers are disposed at every several number of the light-shielding layers as described above, the regions near the column-shaped spacers, which cannot be rubbed, can be reduced to achieve high display quality. The alignment may be achieved by ultraviolet irradiation instead of rubbing. In this case, the alignment can be reliably performed in the regions of the alignment film near the column-shaped spacers.

After the counter substrate and the TFT substrate 2001 are bonded to each other as described above, liquid crystals are sealed in the gap formed between the TFT substrate and the counter substrate by the spacer, thereby forming a liquid crystal display panel of a longitudinal field scheme in the TN mode or the VA mode. Lastly, a polarization plate, a wave plate, a drive circuit, a backlight unit, and the like are disposed outside of the liquid crystal display panel, which completes manufacturing of an LCD.

<Summary of First Preferred Embodiment>

According to the first preferred embodiment configured as described above, since the R coloring layer 51, the G coloring layer 61, and the B coloring layer 71 include the respective protrusion patterns 51a, 61a, and 71a not separately nor independently provided therefrom, peeling due to insufficient adhesive force is unlikely to occur. In addition, the two-layer coloring laminated body, not a single-layer coloring layer, is disposed as a light-shielding layer above each TFT 15. Thus, when a pattern loss has occurred to one of two coloring layers included in one light-shielding layer, the other coloring layer can cover the TFT 15.

According to the first preferred embodiment, the lowermost layer of each light-shielding layer is the R coloring layer 51 or the G coloring layer 61. Accordingly, a coloring layer nearest to the TFT 15 is the R coloring layer 51 or the G coloring layer 61 that blocks ultraviolet light having a wavelength of 400 nm or shorter. With this configuration, ultraviolet light incident through the substrate 1 of the TFT substrate 2001 and reflected in the TFT substrate 2001 can be blocked by the R coloring layer 51 or the G coloring layer 61 before being incident on oxide semiconductor. This configuration can reduce generation of a pixel display defect attributable to characteristic degradation of a light-shielding defect in a display device provided with the TFTs 15 each including the channel layer made of oxide semiconductor.

The above-described configuration is achieved by the coloring layers 51, 61, and 71 in three colors having identical shapes. Thus, the same photoengraving mask can be used for patterning each coloring layer, thereby preventing increase of manufacturing cost.

<Second Preferred Embodiment>
<Configuration of TFT Substrate>

Figure 22:
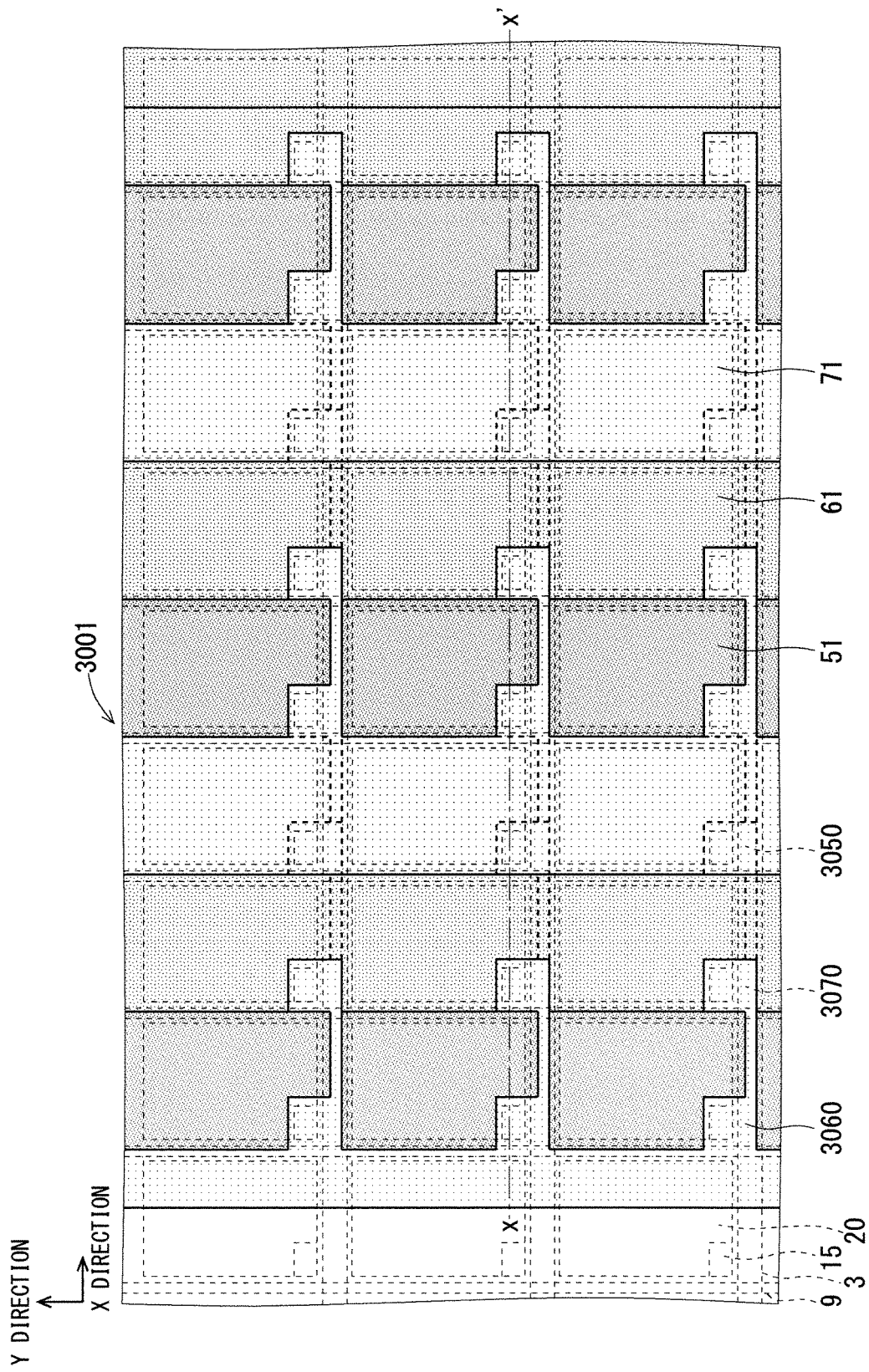
FIG. 22 is a plan view illustrating the configuration of a TFT substrate according to a second preferred embodiment of the present invention.
Figure 23:
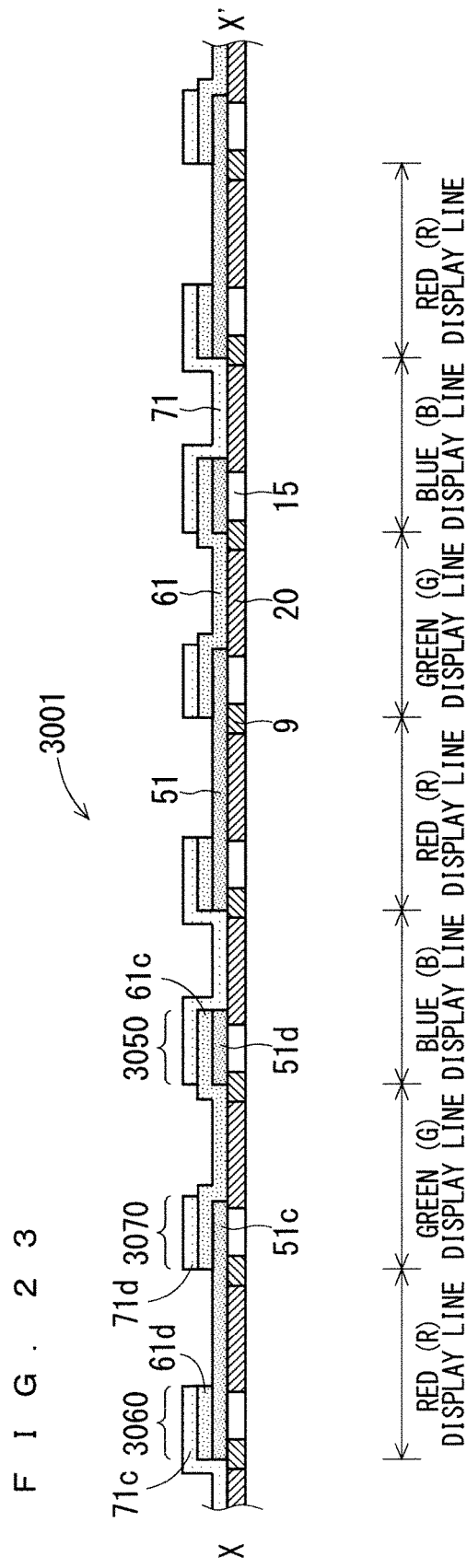
FIG. 23 is a cross-sectional view illustrating the configuration of the TFT substrate according to the second preferred embodiment of the present invention.

In a second preferred embodiment of the present invention, the color filter layers in three colors in the TFT substrate 2001 according to the first preferred embodiment described above have different shapes. FIG. 22 is a plan view illustrating a plane configuration of part of a pixel display region of a TFT substrate 3001 according to the second preferred embodiment. FIG. 23 is a cross-sectional view illustrating a sectional configuration taken along line X-X' in FIG. 22. In the following, the TFT substrate 3001 is included in a display device such as a light transmissive LCD in the TN mode or the VA mode, and any part identical to that of the first preferred embodiment is denoted by an identical reference sign.

As illustrated in FIG. 22, similarly to the first preferred embodiment, the TFT substrate 3001 includes the plurality of gate wires 3 extending in the X direction and the plurality of source wires 9 extending in the Y direction, orthogonally intersecting with each other in the plan view. Similarly to the first preferred embodiment, the TFT substrate 3001 includes the TFTs 15 disposed in a matrix near the intersection points between the wires 3 and 9.

Regions enclosed by the plurality of gate wires 3 and the plurality of source wires 9, which are orthogonal to each other, are pixel regions. The plurality of pixel electrodes 20 are disposed in the plurality of respective pixel regions disposed in a matrix and thus disposed in a matrix similarly to the plurality of pixel regions.

Each TFT 15 is electrically connected with the corresponding gate wire 3 and source wire 9, and also electrically connected with the corresponding pixel electrode 20. The TFT 15 is disposed above the gate electrode as part of the gate wire 3, and thus light incidence on the lower part of the TFT 15 is prevented by the gate electrode. The plurality of TFTs 15 are disposed not to overlap with the plurality of pixel electrodes 20 in the plan view.

As illustrated in FIGS. 22 and 23, the TFT substrate 3001 includes the R coloring layers 51, the G coloring layers 61, and the B coloring layers 71 each overlapping with, in the plan view, two or more of the pixel electrodes 20 adjacent to each other in one direction among the plurality of pixel electrodes 20. In FIG. 22, illustration of coloring layers of pixels at the right and left ends of FIG. 22 is partially omitted to avoid drawing complication.

The R coloring layers 51, the G coloring layers 61, and the B coloring layers 71 extend in the Y direction as the column direction of the above-described matrix and are periodically arrayed in the X direction as the row direction of the above-described matrix. Accordingly, the R coloring layers 51, the G coloring layers 61, and the B coloring layers 71 are arrayed in stripes.

In the second preferred embodiment, end parts of the R coloring layers 51, the
G coloring layers 61, and the B coloring layers 71 overlap with each other in the plan view.

Figure 24:
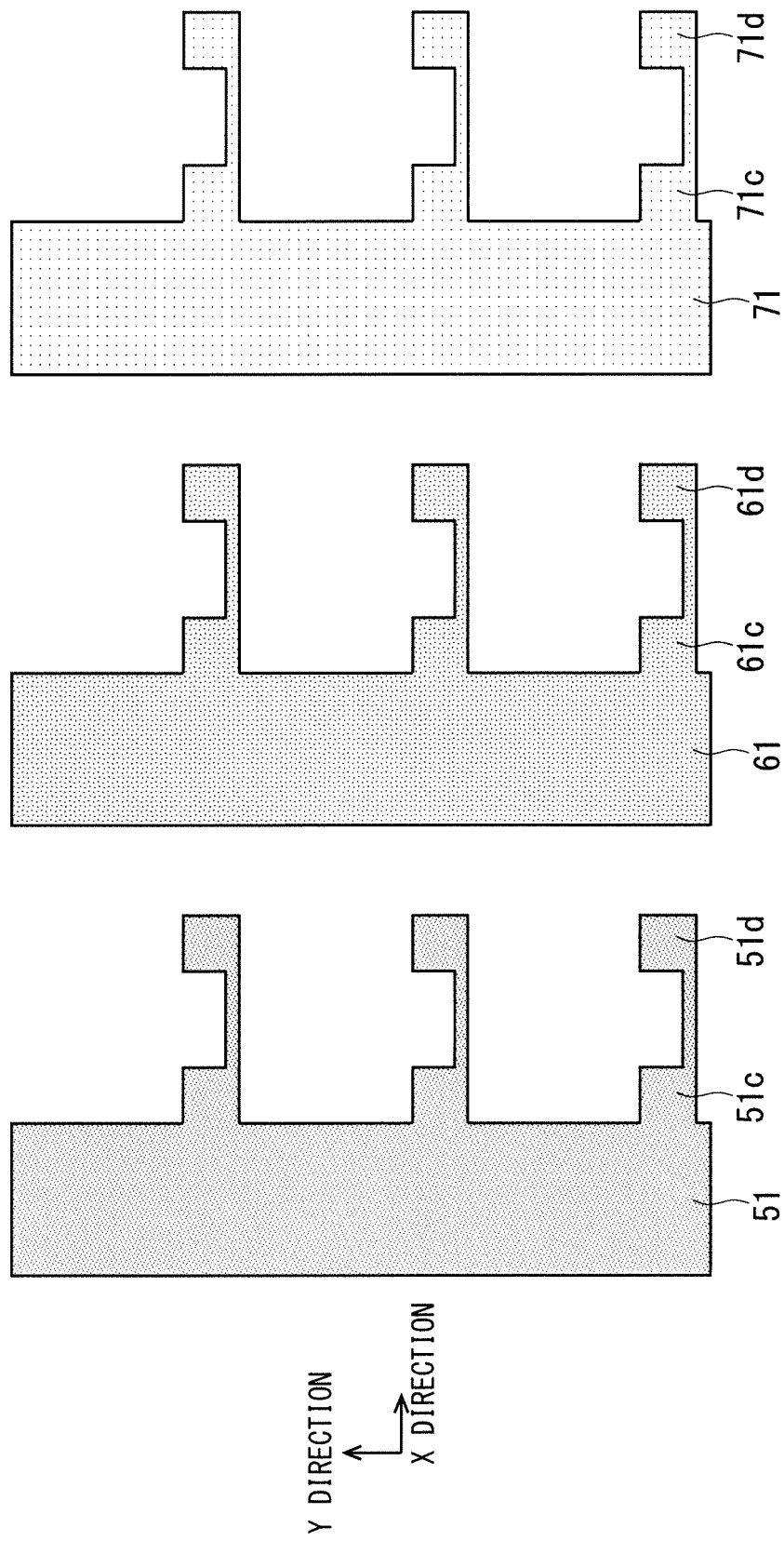
FIG. 24 is a plan view of a color filter pattern of the TFT substrate according to the second preferred embodiment of the present invention.

FIG. 24 is a plan view illustrating the shapes of each R coloring layer 51, each G coloring layer 61, and each B coloring layer 71. As illustrated in FIG. 24, the R coloring layer 51 includes, as the above-described end part of the R coloring layer 51, a protrusion pattern including a partial protrusion pattern 51c bifurcating from the Y direction and protruding in the X direction and a partial protrusion pattern 51d further protruding from the partial protrusion pattern 51c in the X direction. In the second preferred embodiment, the shapes of the G coloring layer 61 and the B coloring layer 71 are same as the shape of the R coloring layer 51. Specifically, the G coloring layer 61 includes, as the above-described end part of the G coloring layer 61, partial protrusion patterns 61c and 61d similarly to the partial protrusion patterns 51c and 51d, and the B coloring layer 71 includes, as the above-described end part of the B coloring layer 71, partial protrusion patterns 71c and 71d similarly to the partial protrusion patterns 51c and 51d.

As illustrated in FIGS. 22 and 23, an R-G-B light-shielding layer 3050 as a coloring laminated body includes the partial protrusion pattern 51d of the R coloring layer 51 as a lower layer, the partial protrusion pattern 61c of the G coloring layer 61 as an intermediate layer positioned relative to the R coloring layer 51 in the X direction, and an end part of the B coloring layer 71 as an upper layer positioned relative to the G coloring layer 61 in the X direction. The R-G-B light-shielding layer 3050 is disposed to cover, from above, the channel layer of the TFT 15 electrically connected with the pixel electrode 20 overlapping with the B coloring layer 71 in the plan view.

Similarly, an R-G-B light-shielding layer 3060 as a coloring laminated body includes the partial protrusion pattern 61d of the G coloring layer 61 as an intermediate layer, the partial protrusion pattern 71c of the B coloring layer 71 as an upper layer positioned relative to the G coloring layer 61 in the X direction, and an end part of the R coloring layer 51 as a lower layer positioned relative to the B coloring layer 71 in the X direction. The R-G-B light-shielding layer 3060 is disposed to cover, from above, the channel layer of the TFT 15 electrically connected with the pixel electrode 20 overlapping with the R coloring layer 51 in the plan view.

Similarly, an R-G-B light-shielding layer 3070 as a coloring laminated body includes the partial protrusion pattern 71d of the B coloring layer 71 as an upper layer, the partial protrusion pattern 51c of the R coloring layer 51 as a lower layer positioned relative to the B coloring layer 71 in the X direction, and an end part of the G coloring layer 61 as an intermediate layer positioned relative to the R coloring layer 51 in the X direction. The R-G-B light-shielding layer 3070 is disposed to cover, from above, the channel layer of the TFT 15 electrically connected with the pixel electrode 20 overlapping with the G coloring layer 61 in the plan view.

Assembly and manufacturing methods for a liquid crystal display panel according to the second preferred embodiment are applied to the R coloring layer 51, the G coloring layer 61, and the B coloring layer 71 having the pattern shapes illustrated in FIG. 24 in the second preferred embodiment in place of the pattern shapes illustrated in FIG. 3 in the first preferred embodiment, and thus are basically same as those described in the first preferred embodiment. For this reason, description thereof is omitted.

<Summary of the Second Preferred Embodiment>

According to the second preferred embodiment configured as described above, since the R coloring layer 51, the G coloring layer 61, and the B coloring layer 71 includes the partial protrusion patterns not separately nor independently provided therefrom, peeling due to insufficient adhesive force is unlikely to occur. In addition, the three-layer coloring laminated body, not a single-layer coloring layer, is disposed as a light-shielding layer above each TFT 15. Thus, when a pattern loss has occurred to one of three coloring layers included in one light-shielding layer, the other coloring layers can cover the TFT 15. The light-shielding layers 3050 to 3070 can be higher than the light-shielding layers 2050 to 2070 according to the first preferred embodiment, and thus the photosensitive resin for forming the column-shaped spacer can be applied in a further smaller film thickness. As a result, productivity can be further increased.

According to the second preferred embodiment, the lowermost layer of each light-shielding layer is the R coloring layer 51 that blocks ultraviolet light having a wavelength of 400 nm or shorter, the intermediate layer of the light-shielding layer is the G coloring layer 61 that blocks the ultraviolet light, and the upper layer of the light-shielding layer is the B coloring layer 71. In this manner, each light-shielding layer includes the three coloring layers 51, 61, and 71. This configuration can reduce generation of a pixel display defect attributable to characteristic degradation of a light-shielding defect in a display device provided with the TFTs 15 each including the channel layer made of oxide semiconductor.

The above-described configuration is achieved by the coloring layers 51, 61, and 71 in three colors having identical shapes. Thus, the same photoengraving mask can be used for patterning each coloring layer, thereby preventing increase of manufacturing cost.

<Third Preferred Embodiment>
<Configuration of TFT Substrate>

A third preferred embodiment of the present invention is different from the first preferred embodiment in that the TFT substrate 2001 according to the first preferred embodiment illustrated in FIGS. 1 and 2 further includes a flattening insulation film as a fourth insulation film. The flattening insulation film is a resin insulating layer disposed on the coloring layers 51, 61, and 71 in three colors and including a flattened upper surface.

<Manufacturing Method>

The following describes a method of manufacturing a TFT substrate 4001 according to the third preferred embodiment with reference to FIGS. 25 to 28 in addition to FIGS. 4 to 17. FIGS. 4 to 17 are shared with the manufacturing method according to the first preferred embodiment. FIGS. 4, 6, 8, 10, 12, 14, 16, 25, and 27 are plane process diagrams illustrating the method of manufacturing the TFT substrate according to the third preferred embodiment. FIGS. 5, 7, 9, 11, 13, 15, 17, 26, and 28 are sectional process diagrams of sectional configurations taken along line X-X', line Y-Y', and line Z-Z' in the plane process diagram. In the drawings, any part identical to that of the first preferred embodiment is denoted by an identical reference sign.

Processes in FIGS. 4 to 17 are same as the processes in FIGS. 4 to 17 described in the first preferred embodiment, and thus the following describes processes in FIGS. 16 and 17 and later.

After the coloring layers 51, 61, and 71 in three colors are formed (FIGS. 16 and 17), the fourth insulation film as a material of a flattening insulation film 307 is formed on the entire upper main surface of the substrate 1 including these coloring layers.

In this example, the fourth insulation film is a resin insulation film made of an organic resin material. In the formation of the fourth insulation film, for example, a light-sensitive acrylic organic resin material is applied on the substrate 1 by spin coating to have a thickness of 2.0 to 3.0 µm. The viscosity of the acrylic organic resin material is preferably adjusted and optimized so that the applied organic resin film has a surface flattened as much as possible.

Figure 25:
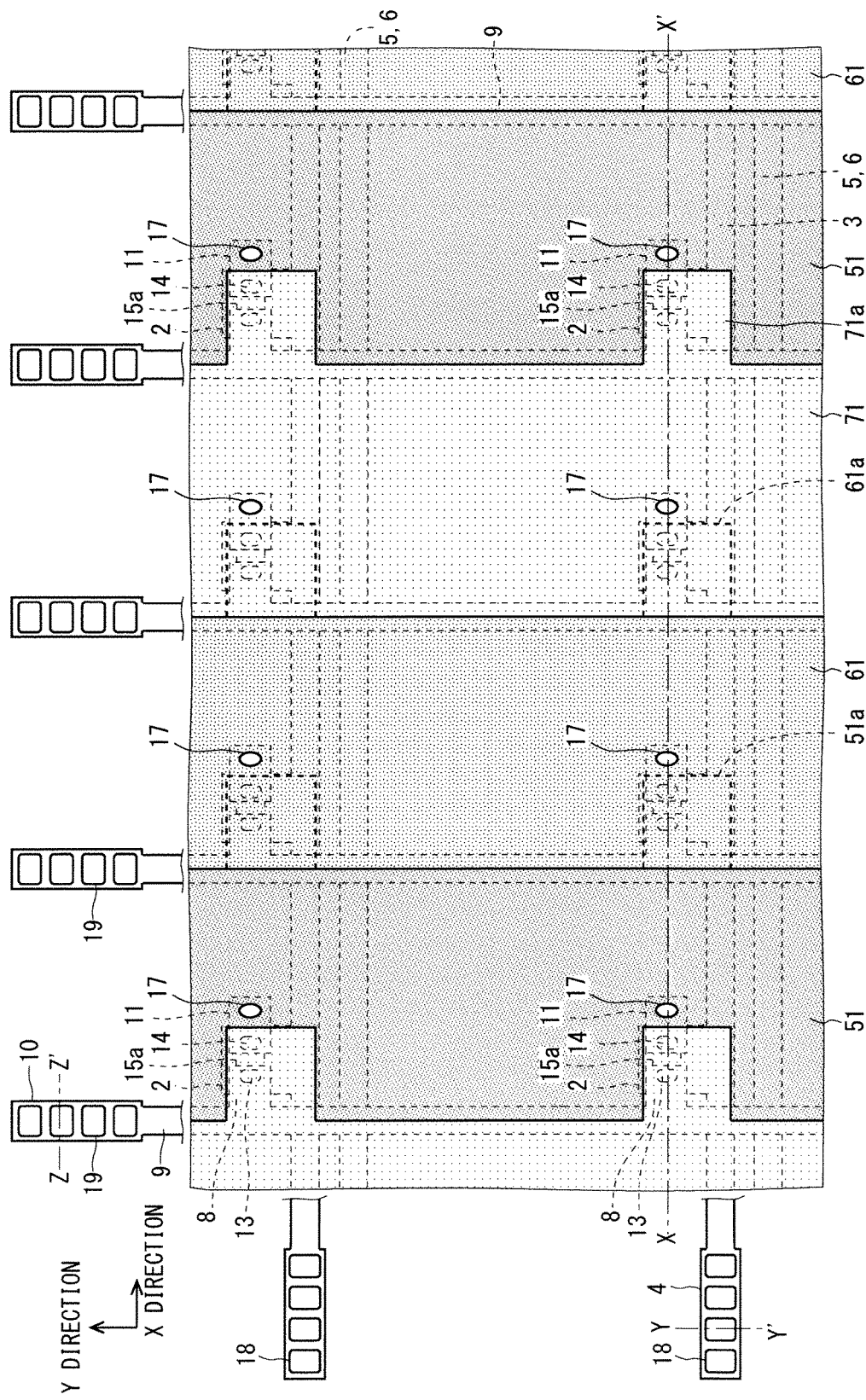
FIG. 25 is a plan view illustrating a method of manufacturing a TFT substrate according to a third preferred embodiment of the present invention.
Figure 26:
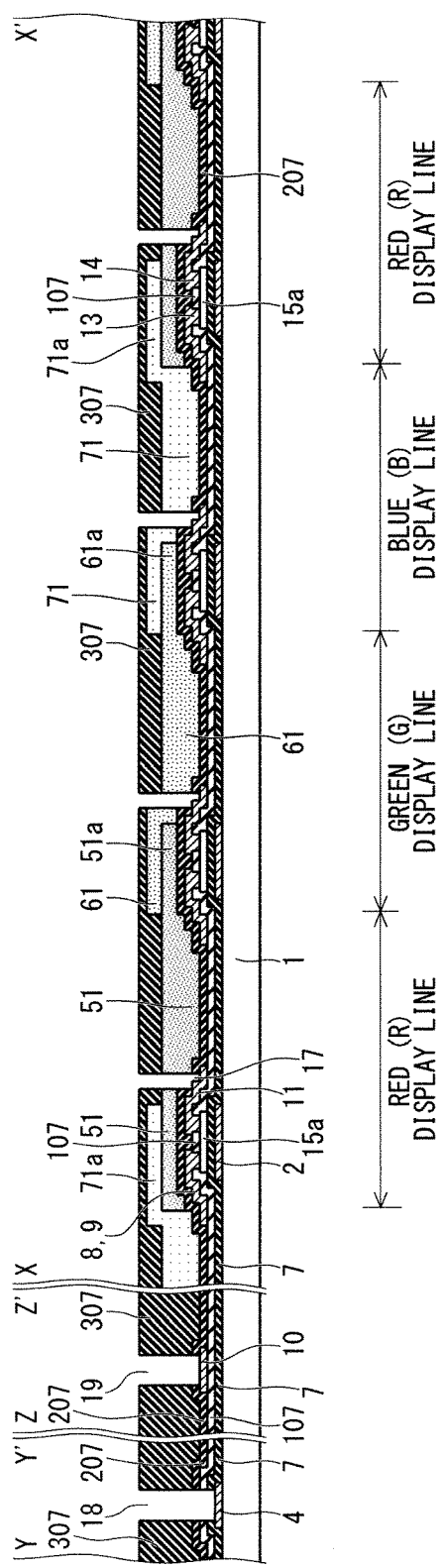
FIG. 26 is a cross-sectional view illustrating the method of manufacturing the TFT substrate according to the third preferred embodiment of the present invention.

Subsequently, the organic resin film is patterned by exposure and development through the eighth photoengraving process to form the flattening insulation film 307 as an interlayer insulation film disposed on the coloring layers 51, 61, and 71 in three colors and including the flattened upper surface as illustrated in FIGS. 25 and 26. Thereafter, the flattening insulation film 307 is used a mask to form the gate insulation film 7, the channel protective film 107, and the protection insulation film 207 by etching. In this example, dry etching is performed with gas of $SF_6$ with addition of $O_2$. This etching forms the pixel drain contact hole 17 above the drain electrode 11, the gate terminal contact hole 18 above the gate terminal 4, and the source terminal contact hole 19 above the source terminal 10 as illustrated in FIGS. 25 and 26. Thereafter, the photoresist pattern (not illustrated) is removed.

The pixel drain contact holes 17 are formed at positions corresponding to the pixel drain contact holes 17R, 17G, and 17B of the R coloring layer 51, the G coloring layer 61, and the B coloring layer 71. Each pixel drain contact hole 17 penetrates through the protection insulation film 207, the flattening insulation film 307, and any one of the R coloring layer 51, the G coloring layer 61, and the B coloring layer 71 so that the drain electrode 11 is exposed. Each gate terminal contact hole 18 penetrates through the flattening insulation film 307, the protection insulation film 207, the channel protective film 107, and the gate insulation film 7 so that the gate terminal 4 is exposed. Each source terminal contact hole 19 penetrates through the flattening insulation film 307 and the protection insulation film 207 so that the source terminal 10 is exposed.

The dry etching with the above-described gas of $SF_6$ with addition of $O_2$ etches the SiN film and the SiO film as materials of the gate insulation film 7, the channel protective film 107, and the protection insulation film 207, but not the first conductive film and the second conductive film made of the metals and alloys as materials of the gate terminal 4, the source terminal 10, and the drain electrode 11. Thus, the etching stops substantially when the first conductive film and the second conductive film are exposed on bottom surfaces of the corresponding contact holes. Accordingly, the pixel drain contact hole 17, the gate terminal contact hole 18, and the source terminal contact hole 19 can be simultaneously formed through single dry etching.

Subsequently, the third conductive film is formed on the entire upper main surface of the substrate 1 on which the flattening insulation film 307 is formed. In the third preferred embodiment, the third conductive film is a transparent conductive film having a translucent property. Examples of the transparent conductive film include an ITO film made of $In_2O_3$ and $SnO_2$ in a mixture ratio of 90:1 in wt %. In this example, an ITO film having a thickness of 100 nm is formed in an amorphous state by sputtering using gas including a H containing gas such as $H_2$ gas or $H_2O$ with argon Ar.

Then, a photoresist pattern is formed of a photoresist material applied on the entire surface of the third conductive film, which is the amorphous ITO film, through the ninth photoengraving process and then used as a mask to pattern the third conductive film by etching. The third conductive film is etched by wet etching with solution containing oxalic acid. Thereafter, the photoresist pattern (not illustrated) is removed.

Figure 27:
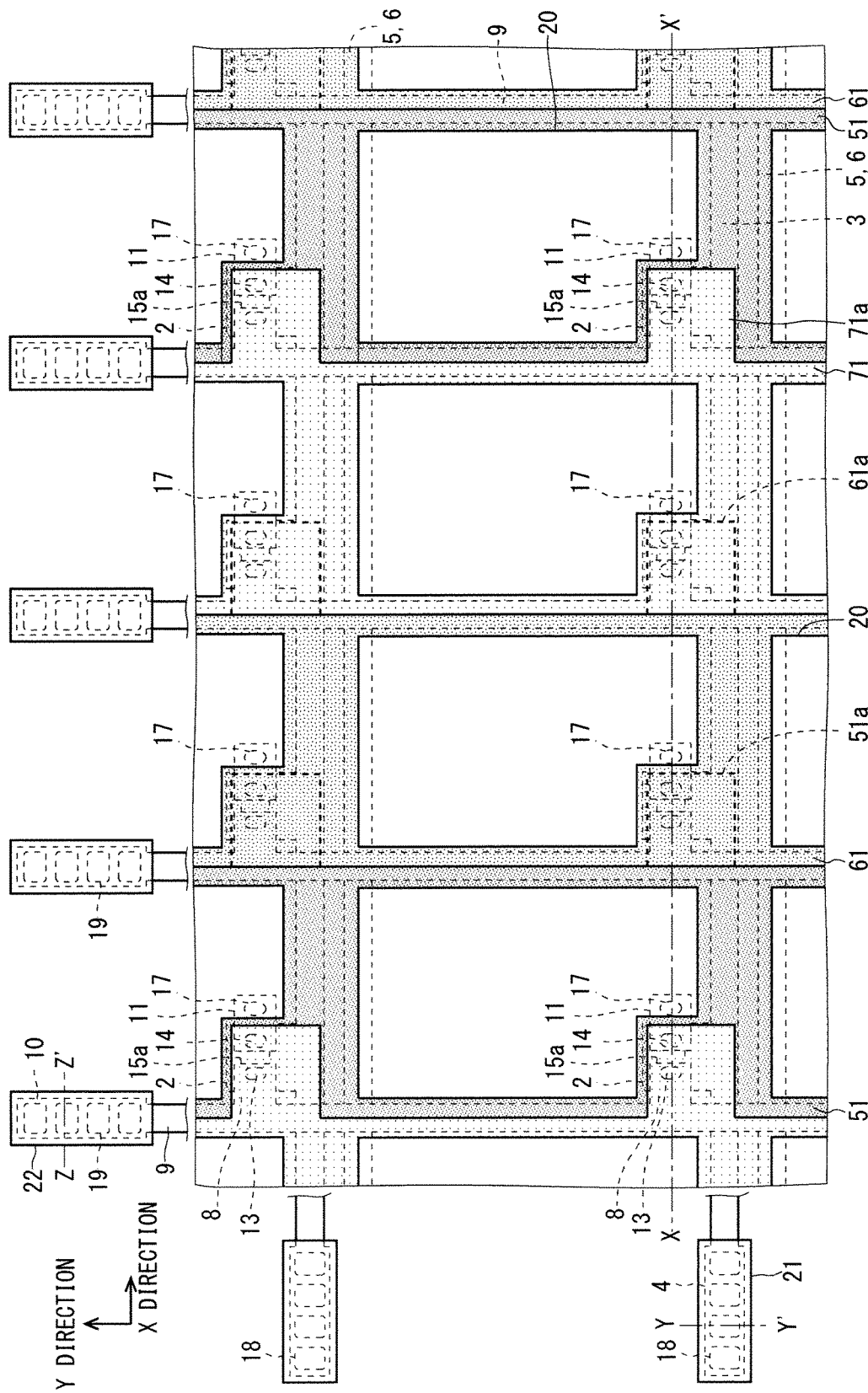
FIG. 27 is a plan view illustrating the method of manufacturing the TFT substrate according to the third preferred embodiment of the present invention.
Figure 28:
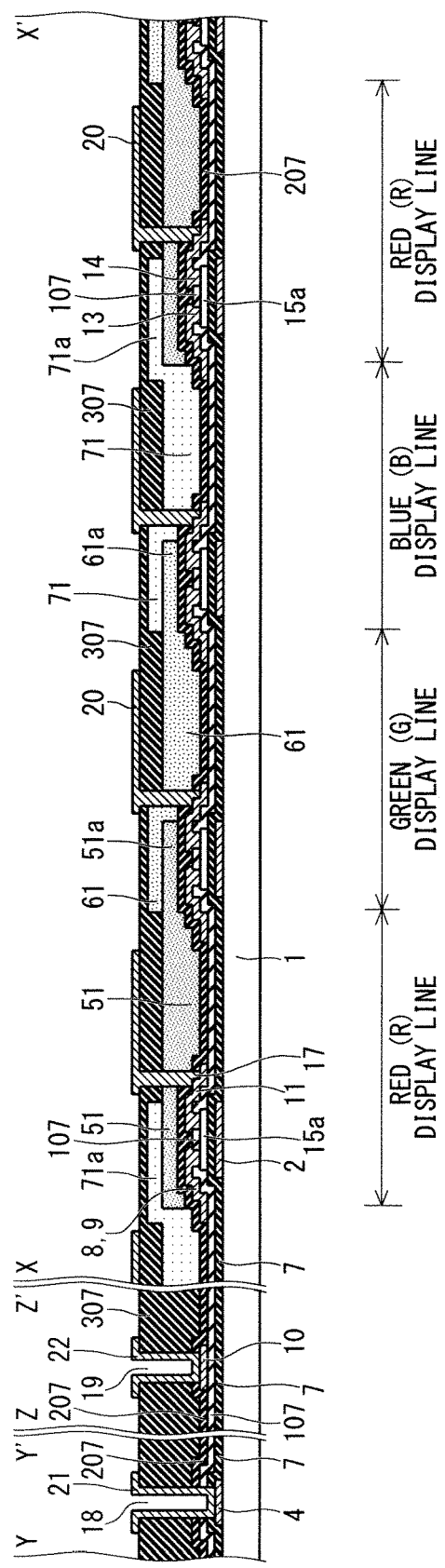
FIG. 28 is a cross-sectional view illustrating the method of manufacturing the TFT substrate according to the third preferred embodiment of the present invention.

Subsequently, the entire substrate 1 is heated to 200° C. so that the amorphous ITO film is crystallized into a polycrystalline ITO film, and as a result, the pixel electrode 20, the gate terminal pad 21, and the source terminal pad 22 are formed on the flattened upper surface of the flattening insulation film 307 as illustrated in FIGS. 27 and 28. The pixel electrode 20, the gate terminal pad 21, and the source terminal pad 22 are directly connected with the drain electrode 11, the gate terminal 4, and the source terminal 10, respectively. The above-described heating temperature is not limited to 200° C. For example, the above-described typical amorphous ITO film can be crystallized at 140° C. or higher. The polycrystalline ITO film leads to improved resistance of the pixel electrode 20, the gate terminal pad 21, and the source terminal pad 22 against drug solution, thereby preventing influence of any process damage at later assembly of a liquid crystal display panel.

The TFT substrate 4001 according to the third preferred embodiment is completed through the above-described process. The assembly of the liquid crystal display panel according to the third preferred embodiment is basically same as that described in the first preferred embodiment, and thus description thereof is omitted.

<Summary of the Third Preferred Embodiment>

According to the third preferred embodiment configured as described above, since the R coloring layer 51, the G coloring layer 61, and the B coloring layer 71 include the protrusion patterns not separately nor independently provided therefrom, peeling due to insufficient adhesive force is unlikely to occur. In addition, the two-layer coloring laminated body, not a single-layer coloring layer, is disposed as a light-shielding layer above each TFT 15. Thus, when a pattern loss has occurred to one of two coloring layers included in one light-shielding layer, the other coloring layer can cover the TFT 15.

According to the third preferred embodiment, similarly to the first preferred embodiment, the lowermost layer of each light-shielding layer is the R coloring layer 51 or the G coloring layer 61. Similarly to the first preferred embodiment, this configuration can reduce generation of a pixel display defect attributable to characteristic degradation of a light-shielding defect.

The above-described configuration is achieved by the coloring layers 51, 61, and 71 in three colors having identical shapes. Thus, the same photoengraving mask can be used for patterning each coloring layer, thereby preventing increase of manufacturing cost.

In the third preferred embodiment, the pixel electrode 20 is disposed on a substantially flat surface. This configuration leads to an LCD having less disorder in liquid crystal alignment and achieving high contrast and high display quality.

In the third preferred embodiment, the coloring layers 51, 61, and 71 in three colors may be manufactured in the patterns of the coloring layers 51, 61, and 71 in three colors according to the second preferred embodiment illustrated in FIG. 24.

In this case, similarly to the second preferred embodiment, when a pattern loss has occurred to one of three coloring layers included in one light-shielding layer, the other coloring layers can cover the TFT 15. This configuration can reduce generation of a pixel display defect attributable to characteristic degradation of a light-shielding defect in a display device provided with the TFTs 15 each including the channel layer made of oxide semiconductor. Similarly to the second preferred embodiment, the light-shielding layers 3050 to 3070 can be relatively high, and thus the photosensitive resin for forming the column-shaped spacer can be applied in a further smaller film thickness. As a result, productivity can be further increased.

<Fourth Preferred Embodiment>

In the above-described first to third preferred embodiments, the present invention is applied to a TFT substrate included in a light transmissive liquid crystal display device of a longitudinal electric field scheme in the TN mode or the VA mode. However, in a fourth preferred embodiment described below, the present invention is applied to a TFT substrate included in a light transmissive liquid crystal display device of a transverse electric field scheme in a fringe field switching (FFS) mode.

<Configuration of TFT Substrate>

The TFT substrate in the FFS mode according to the fourth preferred embodiment is, for example, the TFT substrate according to the third preferred embodiment further including an interlayer insulation film as a fifth insulation film and a counter electrode disposed on the interlayer insulation film provided with a slit opening.

Figure 29:
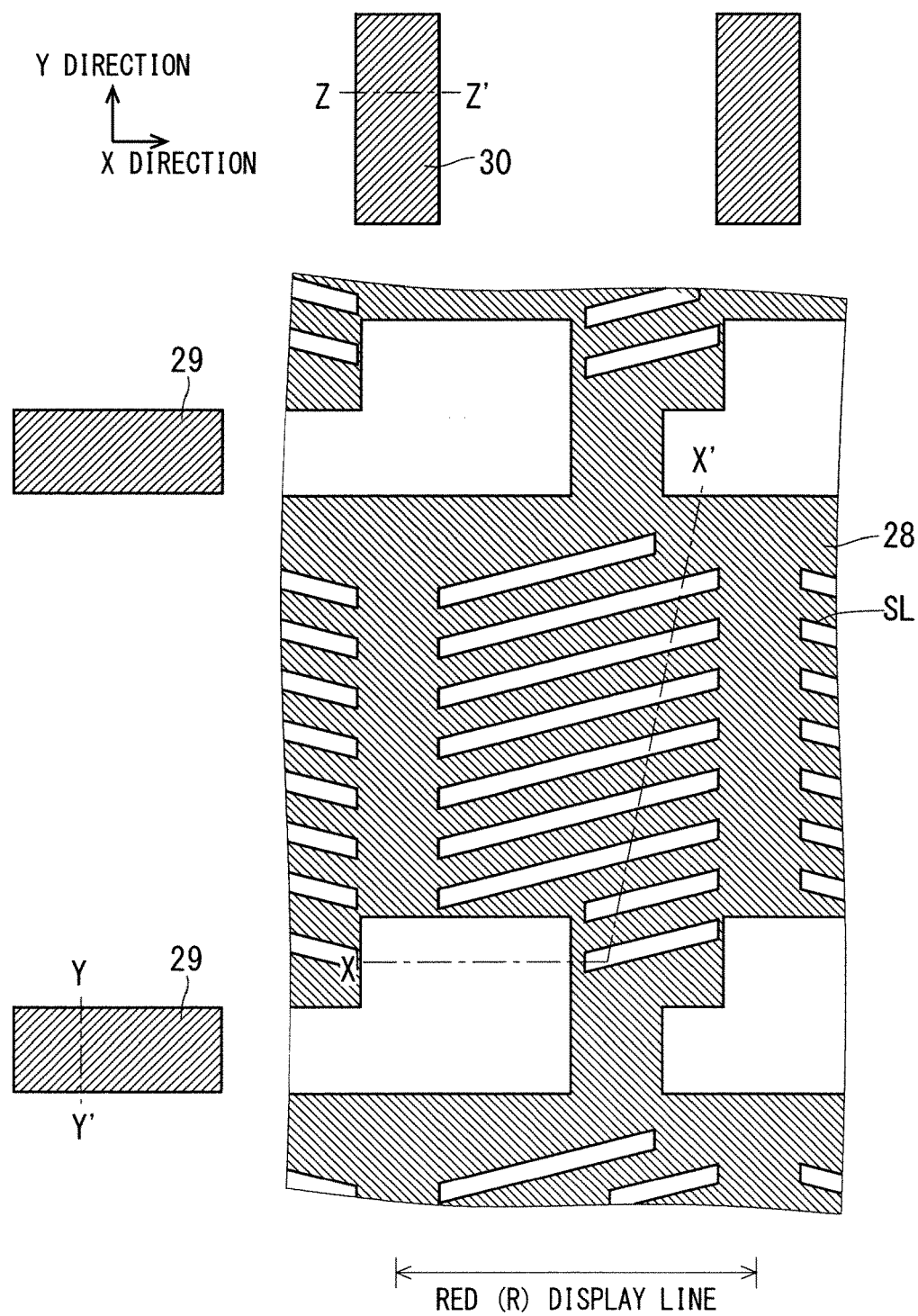
FIG. 29 is a plan view illustrating the configuration of a TFT substrate according to a fourth preferred embodiment of the present invention.
Figure 30:
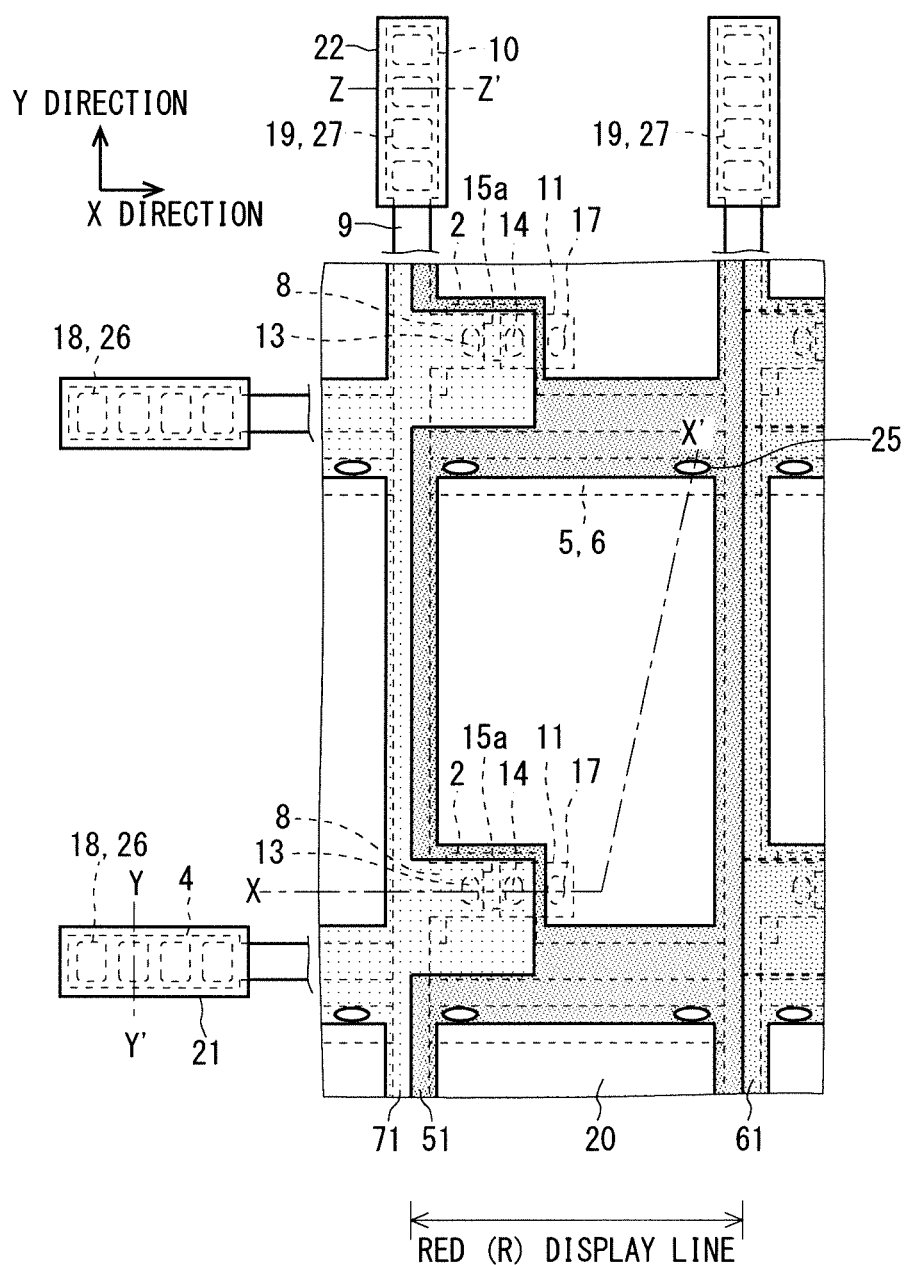
FIG. 30 is a plan view illustrating the configuration of the TFT substrate according to the fourth preferred embodiment of the present invention.
Figure 31:
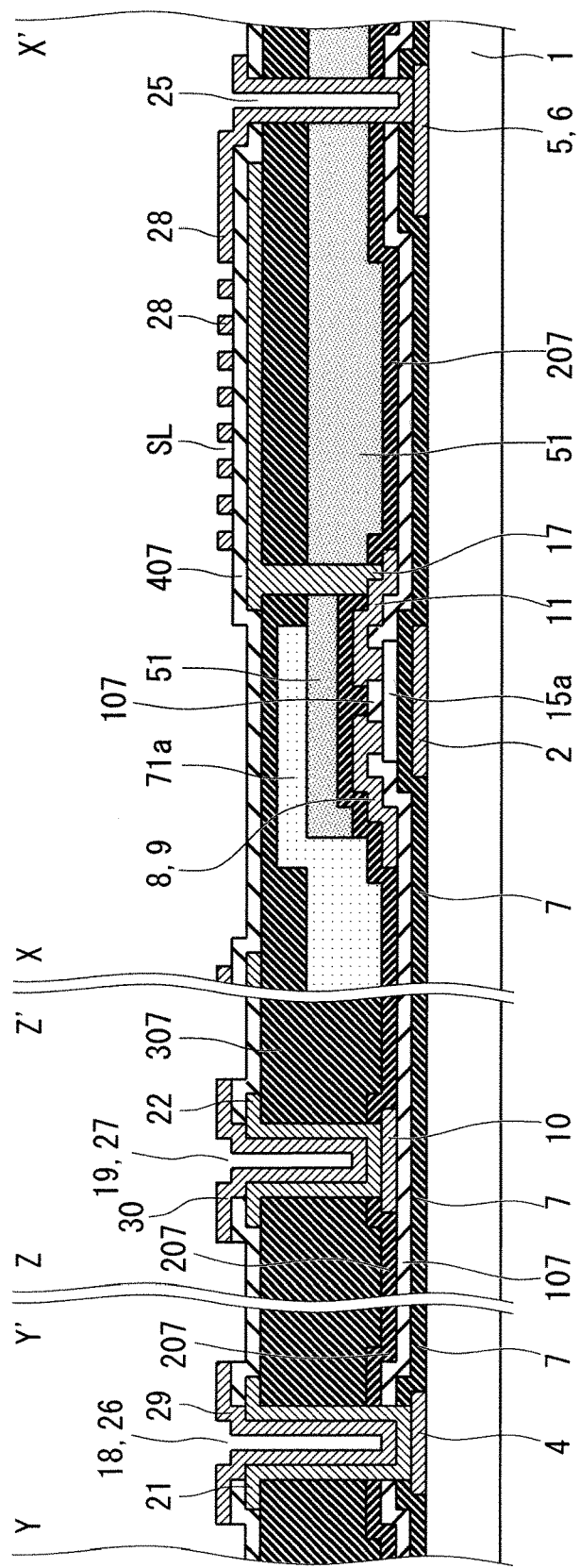
FIG. 31 is a cross-sectional view illustrating the configuration of the TFT substrate according to the fourth preferred embodiment of the present invention.

The following describes the configuration of a TFT substrate 5001 according to the fourth preferred embodiment and a method of manufacturing the substrate with reference to FIGS. 29 to 31. Any component identical to that of the TFT substrate 4001 according to the third preferred embodiment described with reference to FIGS. 1, 2, 27, and 28 is denoted by an identical reference sign, and any duplicate description thereof, including a manufacturing method therefor, is omitted.

FIGS. 29 and 30 are each a plan view illustrating a plane configuration of part of a pixel display region of the TFT substrate 5001 according to the fourth preferred embodiment. FIG. 31 is a cross-sectional view illustrating sectional configurations taken along line X-X', line Y-Y', and line Z-Z' in FIGS. 29 and 30. FIG. 29 is a plan view illustrating the configuration of a counter electrode 28. FIG. 30 is a plan view mainly illustrating the configuration of the TFT substrate 5001 except for the counter electrode 28 illustrated in FIG. 29. FIGS. 29 to 31 mostly illustrate the configuration of the R coloring layer 51.

As illustrated in FIG. 31, in the TFT substrate 5001, the fifth insulation film as a material of an interlayer insulation film 407 is formed on the flattening insulation film 307 of the TFT substrate 4001 according to the third preferred embodiment illustrated in FIG. 28 and the entire upper main surface of the substrate 1 includes the pixel electrode 20. In the fourth preferred embodiment, a SiN film having a thickness of 200 nm is formed as the fifth insulation film through the CVD.

Thereafter, a photoresist pattern is formed through the tenth photoengraving process and then used as a mask to pattern the fifth insulation film by etching. In this example, dry etching is performed with gas of $SF_6$ with addition of $O_2$. Accordingly, as illustrated in FIGS. 30 and 31, a common electrode contact hole 25 is formed above the common electrode 5, a gate terminal contact hole 26 is formed above the gate terminal 4, and a source terminal contact hole 27 is formed above the source terminal 10. This forms the interlayer insulation film 407. Thereafter, the photoresist pattern (not illustrated) is removed.

The common electrode contact hole 25 penetrates through the interlayer insulation film 407, the flattening insulation film 307, any one of the R coloring layer 51, the G coloring layer 61, and the B coloring layer 71, the protection insulation film 207, the channel protective film 107, and the gate insulation film 7 so that the common electrode 5 is exposed. As illustrated in FIG. 30, the common electrode 5 is formed continuously with the common electrode wire 6 extending in the X direction. In other words, a partial region of the common electrode wire 6 functions as the common electrode 5.

The gate terminal contact hole 26 is disposed at a position substantially same as that of the gate terminal contact hole 18 described in the third preferred embodiment, and penetrates through the interlayer insulation film 407 so that the gate terminal pad 21 is exposed.

The source terminal contact hole 27 is disposed at a position substantially same as that of the source terminal contact hole 19 described in the third preferred embodiment, and penetrates through the interlayer insulation film 407 so that the source terminal pad 22 is exposed.

The counter electrode 28 made of a fourth conductive film is disposed on the interlayer insulation film 407, facing to the pixel electrode 20. The counter electrode 28 includes a plurality of slit openings SL provided above the pixel electrode 20. The counter electrode 28 is directly connected with the common electrode 5 therebelow through the common electrode contact hole 25. With this configuration, constant common potential is supplied from the common electrode 5 to the counter electrode 28. Through the voltage application between the pixel electrode 20 and the counter electrode 28, an electric field substantially parallel to the main surface of the substrate 1 can be generated above the counter electrode 28 through the slit openings SL. The counter electrode 28 is provided with the slit openings SL in the fourth preferred embodiment, but may be provided with an opening in such a comb teeth shape that a plurality of slits are connected with each other at ends.

At the gate terminal 4 near line Y-Y', a second gate terminal pad 29 made of the fourth conductive film like the counter electrode 28 is directly connected with the gate terminal pad 21 therebelow through the gate terminal contact hole 26.

At the source terminal 10 near line Z-Z', a second source terminal pad 30 made of the fourth conductive film like the counter electrode 28 is directly connected with the source terminal pad 22 therebelow through the source terminal contact hole 27.

In the fourth preferred embodiment, the fourth conductive film is a transparent conductive film having a translucent property. Examples of the transparent conductive film include an ITO film made of $In_2O_3$ and $SnO_2$ in a mixture ratio of 90:1 in wt %. In this example, an ITO film having a thickness of 100 nm is formed in an amorphous state by sputtering using gas including a H containing gas such as $H_2$ gas or $H_2O$ with argon Ar.

Then, a photoresist pattern is formed of a photoresist material applied on the entire surface of the fourth conductive film, which is the amorphous ITO film, through the eleventh photoengraving process and then used as a mask to pattern the fourth conductive film by etching. The fourth conductive film is etched by wet etching with solution containing oxalic acid. Thereafter, the photoresist pattern (not illustrated) is removed.

Subsequently, the entire substrate 1 is heated to 200° C. so that the amorphous ITO film is crystallized into a polycrystalline ITO film, and as a result, as illustrated in FIGS. 29 and 31, the counter electrode 28, the second gate terminal pad 29, and the second source terminal pad 30 are formed. This heating temperature is not limited to 200° C. For example, the above-described typical amorphous ITO film can be crystallized at 140° C. or higher. The polycrystalline ITO film leads to improved resistance of the counter electrode 28, the second gate terminal pad 29, and the second source terminal pad 30 against drug solution, thereby preventing any influence of a process damage at later assembly of a liquid crystal display panel.

The TFT substrate 5001 for the FFS mode according to the fourth preferred embodiment illustrated in FIGS. 29 to 31 is completed through the above-described process. At the assembly of a liquid crystal display panel, first, an alignment film and a spacer are formed on a surface of the TFT substrate 5001 as described above. The alignment film is a film for arraying liquid crystals and made of, for example, polyimide. Each light-shielding layer functions as a base of the spacer.

Subsequently, a counter substrate (not illustrated) separately produced and including, for example, a counter electrode and an alignment film is bonded to the TFT substrate 5001 through the spacer and the like. In this case, liquid crystals are sealed in a gap formed between the TFT substrate 5001 and the counter substrate by the spacer, thereby forming a liquid crystal display panel of the transverse electric field scheme in the FFS mode. Lastly, a polarization plate, a wave plate, a drive circuit, a backlight unit, and the like are disposed outside of the liquid crystal display panel, which completes manufacturing of an LCD.

In the above-described fourth preferred embodiment, the TFT substrate in the FFS mode is achieved based on the TFT substrates in the TN mode according to the first and third preferred embodiments, but may be achieved based on the TFT substrates in the TN mode according to the second and third preferred embodiments. With this configuration, the TFT substrate in the FFS mode can achieve the effects described in the first to third preferred embodiments.

<Modification>

In the above-described first to fourth preferred embodiments, a drive circuit configured to supply scanning and display signals for driving liquid crystals is externally connected with a TFT substrate. However, as described below, a TFT substrate including a channel layer made of an oxide semiconductor having high mobility may include a TFT same as that of a pixel TFT, and a drive circuit configured to drive the pixel TFT may be disposed on a peripheral part of a pixel display region of the TFT substrate. In other words, a drive-circuit built-in TFT substrate is applicable. With this configuration, the pixel TFT and the drive circuit including a TFT can be formed simultaneously.

<Configuration of TFT Substrate>

FIG. 32 is a plan view schematically illustrating the configuration of a TFT substrate 6001 according to the present modification, which is a drive-circuit built-in TFT substrate. As illustrated in FIG. 32, an upper main surface of the TFT substrate 6001 is roughly divided into a display region 40 as a pixel display region in which a plurality of pixels are arrayed in a matrix, and a frame region 50 adjacent to the display region 40. FIG. 32 also illustrates an alignment mark 89.

The plurality of gate wires 3, the gate insulation film 7, the plurality of source wires 9, the TFTs 15, the pixel electrode 20, and the coloring layers 51, 61, and 71 in three colors, which are described in the first to fourth preferred embodiments, are disposed in the display region 40 of the TFT substrate 6001. In the following description, the TFT 15 provided for each pixel in the display region 40 is also referred to as the pixel TFT 15. To avoid drawing complication, FIG. 32 schematically illustrates the pixel TFT 15 and the pixel electrode 20 of one pixel.

The frame region 50 includes a scanning signal drive circuit 80 configured to provide a drive voltage to the gate wire 3, and a display signal drive circuit 82 configured to provide a drive voltage to the source wire 9. In the present modification, the scanning signal drive circuit 80 and the display signal drive circuit 82 are both disposed in the frame region 50, but only one of the circuits 80 and 82 may be disposed in the frame region 50.

The following briefly describes operation of the scanning signal drive circuit 80 and the display signal drive circuit 82. The scanning signal drive circuit 80 sequentially selects the gate wire 3 and applies a gate-on voltage to the selected gate wire 3. Accordingly, the pixel TFTs 15 connected with the selected gate wire 3 are all turned on. The display signal drive circuit 82 applies display signal current, through the source wires 9, to the pixel TFTs 15 thus turned on. Accordingly, electric charge accumulates at the pixel electrode 20 connected with each pixel TFT 15 being turned on. The display signal drive circuit 82 controls current, in other words, electric charge supplied to each pixel electrode 20, in accordance with a gradation level of each pixel. In this manner, the scanning signal drive circuit 80 and the display signal drive circuit 82 can drive a plurality of pixel TFTs 15.

In the present modification, the scanning signal drive circuit 80 includes a drive circuit TFT 84 as a second thin film transistor disposed on the substrate 1 separately from the plurality of pixel TFTs 15. To avoid drawing complication, FIG. 32 schematically illustrates one drive circuit TFT 84. Although not illustrated, the display signal drive circuit 82 includes another drive circuit TFT 84.

The drive circuit TFT 84 is formed simultaneously with the pixel TFTs 15 in a manner same as that for the pixel TFTs 15 through a process of forming the pixel TFTs 15. Thus, similarly to the pixel TFTs 15, the drive circuit TFT 84 includes an oxide semiconductor layer as a channel layer.

The TFT substrate 6001 according to the present modification includes coloring layers 52, 62, and 72 in three colors disposed separately from the coloring layers 51, 61, and 71 in three colors and having a plurality of colors same as the three colors of the coloring layers 51, 61, and 71. The coloring layers 52, 62, and 72 in three colors are formed simultaneously with the coloring layers 51, 61, and 71 in three colors in a manner same as that for the coloring layers 51, 61, and 71 in three colors through a process of forming the coloring layers 51, 61, and 71 in three colors.

An R-G-B light-shielding layer 88 is configured as another coloring laminated body including end parts of respective coloring layers in at least two colors among the coloring layers 51, 61, and 71 in three colors and covering the channel layer of the drive circuit TFT 84, the end parts overlapping with each other in the plan view. In FIG. 32, the R-G-B light-shielding layer 88 is illustrated as a coloring laminated body including all end parts of the coloring layers 51, 61, and 71 in three colors, but may be another coloring laminated body including end parts of coloring layers in two colors among the coloring layers 51, 61, and 71 in three colors.

According to the above-described configuration, the drive circuit TFT 84 can achieve effects same as those of the pixel TFT 15 on drive circuits such as the scanning signal drive circuit 80 and the display signal drive circuit 82 without an additional process of newly forming a light-shielding layer. Accordingly, the TFT substrate 6001 can be provided with, at low cost, a stably operational drive circuit that is free from characteristic variation due to optical degradation.

<Other Modifications>

The first to fourth preferred embodiments each describe a thin film transistor in which the channel protective film 107 made of the second insulation film is formed on the semiconductor channel layer 15*a*. However, the present invention is not limited thereto. For example, the source electrode 8 and the drain electrode 11, which are made of the second conductive film, may be directly formed on the semiconductor channel layer 15*a* without forming the channel protective film 107. In this case, the process of forming the channel protective film 107 can be omitted to improve production efficiency.

In the above-described preferred embodiments, the coloring layers 51, 61, and 71 in three colors are formed by the color resist method, but the present invention is not limited thereto. For example, the coloring layers 51, 61, and 71 in three colors may be formed by bonding, exposing, and developing colored films in a plurality of colors. When the coloring layers 51, 61, and 71 in three colors are formed through application by spin coating as in the first to fourth preferred embodiments, the film thicknesses of the coloring layers 51, 61, and 71 in three colors overlapping with each other slightly reduce through the formation in some cases. However, the film thicknesses of the coloring layers 51, 61, and 71 in three colors do not reduce through the formation by using colored films but the film thicknesses of the colored films are maintained. Thus, a more reliable light-shielding effect can be obtained by this formation method using colored films, and the coloring layers 51, 61, and 71 in three colors can be each effectively used as a base for forming the column-shaped spacer.

In the above-described preferred embodiments, the coloring layers 51, 61, and 71 in three colors are in the combination of three primary colors of red, green, and blue, but the present invention is not limited thereto. The coloring layers 51, 61, and 71 in three colors may be in a combination of complementary filters in, for example, yellow, magenta, cyan, and green. In a configuration with the combined complementary filters, when a coloring layer nearest to each TFT 15 blocks ultraviolet light (having a wavelength of 400 nm or shorter) and a light-shielding layer is configured as a plurality of coloring layers stacked on the coloring layer, the same effects as those described above can be effectively obtained.

The present preferred embodiments and modifications of the present invention may be freely combined or may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate comprising:
  a plurality of gate wires disposed on a substrate;
  a gate insulation film covering said plurality of gate wires;
  a plurality of source wires intersecting with said plurality of gate wires in a plan view while being insulated from said plurality of gate wires by said gate insulation film;
  a plurality of first thin film transistors disposed in a matrix and corresponding to a plurality of respective intersection points at which said plurality of gate wires intersect with said plurality of source wires and each including an oxide semiconductor layer as a channel layer;
  a plurality of pixel electrodes disposed in a matrix and electrically connected with said plurality of respective first thin film transistors; and
  coloring layers in a plurality of colors each overlapping with, in the plan view, two or more pixel electrodes adjacent to each other in one direction among said plurality of pixel electrodes, wherein
  a plurality of coloring laminated bodies each including end parts of respective coloring layers in at least two colors among said coloring layers in a plurality of colors, the end parts overlapping with each other in the plan view, covers said channel layers of said plurality of first thin film transistor from above,
  said coloring layers in a plurality of colors are a red coloring layer, a green coloring layer, and a blue coloring layer, and
  each of lowermost layers of all of said coloring laminated bodies is said red coloring layer or said green coloring layer.

2. The thin film transistor substrate according to claim 1, wherein said end parts included in said coloring laminated body are end parts of respective coloring layers in two colors among said coloring layers in a plurality of colors, the end parts overlapping with each other in the plan view.

3. The thin film transistor substrate according to claim 2, wherein
  said coloring layers in a plurality of colors are periodically disposed in said one direction,
  said coloring layers in two colors include a first coloring layer and a second coloring layer positioned relative to said first coloring layer in said one direction,
  said first coloring layer includes a protrusion pattern used as said end part of said first coloring layer and protruding in said one direction in a plan view, and
  said protrusion pattern of said first coloring layer overlaps with said end part of said second coloring layer in the plan view.

4. The thin film transistor substrate according to claim 1, wherein said end parts included in said coloring laminated body are end parts of respective coloring layers in three colors among said coloring layers in a plurality of colors, the end parts overlapping with each other in the plan view.

5. The thin film transistor substrate according to claim 4, wherein
  said coloring layers in a plurality of colors are periodically disposed in said one direction,
  said coloring layers in three colors include a first coloring layer, a second coloring layer positioned relative to said first coloring layer in said one direction, and a third coloring layer positioned relative to said second coloring layer in said one direction,
  said first coloring layer includes a first protrusion pattern used as said end part of said first coloring layer and protruding in said one direction in a plan view,
  said second coloring layer includes a second protrusion pattern used as said end part of said second coloring layer, protruding in said one direction in a plan view, and having a shape same as a shape of said first protrusion pattern, and
  part of said first protrusion pattern of said first coloring layer, part of said second protrusion pattern of said second coloring layer, and said end part of said third coloring layer overlap with each other in the plan view.

6. The thin film transistor substrate according to claim 1, wherein said coloring laminated body functions as a base of a column-shaped spacer for separating said thin film transistor substrate from a counter substrate.

7. The thin film transistor substrate according to claim 1, further comprising a resin insulating layer disposed on said coloring layers in a plurality of colors and including a flattened upper surface, wherein said pixel electrode is disposed on said upper surface of said resin insulating layer.

8. The thin film transistor substrate according to claim 1, further comprising
  a drive circuit that includes a second thin film transistor disposed on said substrate separately from said plurality of first thin film transistors and is configured to drive said plurality of first thin film transistors; and
  other coloring layers in a plurality of colors same as the plurality of colors of said coloring layers, the other coloring layers being disposed separately from said coloring layers in a plurality of colors, wherein
  said second thin film transistor of said drive circuit includes an oxide semiconductor layer as a channel layer, and
  said channel layer of said second thin film transistor is covered by another coloring laminated body including end parts of respective coloring layers in at least two colors among said other coloring layers in a plurality of colors, the end parts overlapping with each other in the plan view.

9. A display device comprising the thin film transistor substrate according to claim 1.

10. A thin film transistor substrate comprising:
a plurality of gate wires disposed on a substrate;
a gate insulation film covering said plurality of gate wires;
a plurality of source wires intersecting with said plurality of gate wires in a plan view while being insulated from said plurality of gate wires by said gate insulation film;
a plurality of first thin film transistors disposed in a matrix and corresponding to a plurality of respective intersection points at which said plurality of gate wires intersect with said plurality of source wires and each including an oxide semiconductor layer as a channel layer;
a plurality of pixel electrodes disposed in a matrix and electrically connected with said plurality of respective first thin film transistors; and
coloring layers in a plurality of colors each overlapping with, in the plan view, two or more pixel electrodes adjacent to each other in one direction among said plurality of pixel electrodes, wherein
a plurality of coloring laminated bodies each including end parts of respective coloring layers in at least two colors among said coloring layers in a plurality of colors, the end parts overlapping with each other in the plan view covers said channel layers of said plurality of first thin film transistor from above, and
each of lowermost layers of all of said coloring laminated bodies is a coloring layer that blocks light having a wavelength of 400 nm or shorter.

11. The thin film transistor substrate according to claim 10, wherein said end parts included in said coloring laminated body are end parts of respective coloring layers in two colors among said coloring layers in a plurality of colors, the end parts overlapping with each other in the plan view.

12. The thin film transistor substrate according to claim 11, wherein
said coloring layers in a plurality of colors are periodically disposed in said one direction,
said coloring layers in two colors include a first coloring layer and a second coloring layer positioned relative to said first coloring layer in said one direction,
said first coloring layer includes a protrusion pattern used as said end part of said first coloring layer and protruding in said one direction in a plan view, and
said protrusion pattern of said first coloring layer overlaps with said end part of said second coloring layer in the plan view.

13. The thin film transistor substrate according to claim 10, wherein said end parts included in said coloring laminated body are end parts of respective coloring layers in three colors among said coloring layers in a plurality of colors, the end parts overlapping with each other in the plan view.

14. The thin film transistor substrate according to claim 13, wherein
said coloring layers in a plurality of colors are periodically disposed in said one direction,
said coloring layers in three colors include a first coloring layer, a second coloring layer positioned relative to said first coloring layer in said one direction, and a third coloring layer positioned relative to said second coloring layer in said one direction,
said first coloring layer includes a first protrusion pattern used as said end part of said first coloring layer and protruding in said one direction in a plan view,
said second coloring layer includes a second protrusion pattern used as said end part of said second coloring layer, protruding in said one direction in a plan view, and having a shape same as a shape of said first protrusion pattern, and
part of said first protrusion pattern of said first coloring layer, part of said second protrusion pattern of said second coloring layer, and said end part of said third coloring layer overlap with each other in the plan view.

15. The thin film transistor substrate according to claim 10, further comprising a resin insulating layer disposed on said coloring layers in a plurality of colors and including a flattened upper surface, wherein said pixel electrode is disposed on said upper surface of said resin insulating layer.

16. The thin film transistor substrate according to claim 10, further comprising:
a drive circuit that includes a second thin film transistor disposed on said substrate separately from said plurality of first thin film transistors and is configured to drive said plurality of first thin film transistors; and
other coloring layers in a plurality of colors same as the plurality of colors of said coloring layers, the other coloring layers being disposed separately from said coloring layers in a plurality of colors, wherein
said second thin film transistor of said drive circuit includes an oxide semiconductor layer as a channel layer, and
another coloring laminated body including end parts of respective coloring layers in at least two colors among said other coloring layers in a plurality of colors, the end parts overlapping with each other in the plan view, covers said channel layer of said second thin film transistor.

17. A method of manufacturing a thin film transistor substrate, the method comprising:
forming a plurality of gate wires on a substrate;
forming a gate insulation film covering said plurality of gate wires;
forming a plurality of oxide semiconductor layers as channel layers of a plurality of respective first thin film transistors on said gate insulation film so that said plurality of oxide semiconductor layers overlap with a plurality of gate electrodes as part of said plurality of gate wires in a plan view;
forming a plurality of source wires intersecting with said plurality of gate wires in the plan view while being insulated from said plurality of gate wires by said gate insulation film, and electrically connected with said plurality of oxide semiconductor layers through a plurality of source electrodes;
forming coloring layers in a plurality of colors arrayed in a matrix and adjacent to each other in one direction; and
forming a plurality of pixel electrodes overlapping with said respective coloring layers in a plurality of colors in a plan view and electrically connected with said plurality of respective first thin film transistors, wherein
a plurality of coloring laminated bodies each including end parts of respective coloring layers in at least two colors among said coloring layers in a plurality of colors, the end parts overlapping with each other in the plan view, covers said channel layers of said plurality of first thin film transistor from above,
said coloring layers in a plurality of colors are a red coloring layer, a green coloring layer, and a blue coloring layer, and
each of lowermost layers of all of said coloring laminated bodies is said red coloring layer or said green coloring layer.

18. The method of manufacturing a thin film transistor substrate according to claim 17, wherein said coloring layers in a plurality of colors are formed through bonding, exposure, and development of colored films in a plurality of colors.

19. A method of manufacturing a thin film transistor substrate, the method comprising:
  forming a plurality of gate wires on a substrate;
  forming a gate insulation film covering said plurality of gate wires;
  forming a plurality of oxide semiconductor layers as channel layers of a plurality of respective first thin film transistors on said gate insulation film so that said plurality of oxide semiconductor layers overlap with a plurality of gate electrodes as part of said plurality of gate wires in a plan view;
  forming a plurality of source wires intersecting with said plurality of gate wires in the plan view while being insulated from said plurality of gate wires by said gate insulation film, and electrically connected with said plurality of oxide semiconductor layers through a plurality of source electrodes;
  forming coloring layers in a plurality of colors arrayed in a matrix and adjacent to each other in one direction; and
  forming a plurality of pixel electrodes overlapping with said respective coloring layers in a plurality of colors in a plan view and electrically connected with said plurality of respective first thin film transistors, wherein
  a plurality of coloring laminated bodies each including end parts of respective coloring layers in at least two colors among said coloring layers in a plurality of colors, the end parts overlapping with each other in the plan view covers said channel layers of said plurality of first thin film transistor from above, and
  each of lowermost layers of said all of coloring laminated bodies is a coloring layer that blocks light having a wavelength of 400 nm or shorter.

20. The method of manufacturing a thin film transistor substrate according to claim 19, wherein said coloring layers in a plurality of colors are formed through bonding, exposure, and development of colored films in a plurality of colors.

* * * * *